United States Patent
Shinohara et al.

(10) Patent No.: US 8,791,469 B2
(45) Date of Patent: Jul. 29, 2014

(54) SEMICONDUCTOR LIGHT EMITTING ELEMENT HAVING A PLURALITY OF SUBSTRATE CUTOUTS AND SEMICONDUCTOR LAYER SIDE SURFACE PROJECTIONS

(71) Applicant: Toyoda Gosei Co., Ltd., Kiyosu (JP)

(72) Inventors: Hironao Shinohara, Ichihara (JP); Kensuke Hirano, Ichihara (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 13/693,460

(22) Filed: Dec. 4, 2012

(65) Prior Publication Data
US 2013/0175571 A1    Jul. 11, 2013

(30) Foreign Application Priority Data

Dec. 5, 2011  (JP) ................................. 2011-265909

(51) Int. Cl.
| | |
|---|---|
| H01L 27/15 | (2006.01) |
| H01L 29/26 | (2006.01) |
| H01L 31/12 | (2006.01) |
| H01L 33/00 | (2010.01) |
| H01L 33/20 | (2010.01) |
| H01L 33/22 | (2010.01) |

(52) U.S. Cl.
CPC ................ *H01L 33/20* (2013.01); *H01L 33/22* (2013.01); *H01L 33/005* (2013.01); *H01L 33/0095* (2013.01)
USPC ................ 257/79; 257/E31.13; 257/E33.005; 257/E33.006; 257/E33.011; 257/E33.074

(58) Field of Classification Search
USPC ............. 257/79, E33.005, E33.006, E33.011, 257/E33.074, E31.13
See application file for complete search history.

(56) References Cited

U.S. PATENT DOCUMENTS

| | | | | |
|---|---|---|---|---|
| 6,809,340 B2 * | 10/2004 | Kato et al. | ...................... | 257/79 |
| 6,992,333 B2 * | 1/2006 | Nagai et al. | ..................... | 257/88 |
| 7,172,684 B2 * | 2/2007 | Cohen et al. | ................... | 205/118 |
| 7,595,514 B2 * | 9/2009 | Lai | ................... | 257/99 |
| 7,671,428 B2 * | 3/2010 | Patel et al. | ..................... | 257/414 |
| 7,798,681 B2 * | 9/2010 | Wang et al. | ................... | 362/351 |
| 7,956,373 B2 * | 6/2011 | Wang et al. | .................... | 257/98 |
| 8,120,049 B2 * | 2/2012 | Matsuo et al. | .................. | 257/98 |

(Continued)

FOREIGN PATENT DOCUMENTS

| | | | |
|---|---|---|---|
| JP | 4-116848 A | | 4/1992 |
| JP | 10093135 A | * | 4/1998 |

(Continued)

*Primary Examiner* — Ida M Soward
(74) *Attorney, Agent, or Firm* — Sughrue Mion, PLLC

(57) ABSTRACT

In a semiconductor light emitting element (1) having a sapphire substrate (100), and lower (210) and upper (220) semiconductor layers laminated on the sapphire substrate, the substrate includes a substrate top surface (113), a substrate bottom surface (114), first substrate side surfaces (111) and second substrate side surfaces (112); plural first (121*a*) and second (122*a*) cutouts are provided at a border between the first substrate side surface, the second substrate side surface and the substrate top surface; the lower semiconductor layer includes a lower semiconductor bottom surface, a lower semiconductor top surface (213), first lower semiconductor side surfaces (211) and second lower semiconductor side surfaces (212); plural first projecting portions (211*a*) and plural first depressing portions (211*b*) are provided on the first lower semiconductor side surface; and plural second protruding portions (212*a*) and second flat portions (212*b*) are provided on the second lower semiconductor side surface.

20 Claims, 14 Drawing Sheets

(56) References Cited

U.S. PATENT DOCUMENTS

| | | | |
|---|---|---|---|
| 8,304,800 B2* | 11/2012 | Beom et al. | 257/98 |
| 8,338,203 B2* | 12/2012 | Kusunoki | 438/33 |
| 2004/0070004 A1* | 4/2004 | Eliashevich et al. | 257/200 |
| 2005/0012107 A1* | 1/2005 | Shei et al. | 257/98 |
| 2005/0179130 A1 | 8/2005 | Tanaka et al. | |
| 2005/0186760 A1 | 8/2005 | Hashimura et al. | |
| 2007/0176181 A1 | 8/2007 | Kusunoki | |
| 2008/0191226 A1 | 8/2008 | Urashima | |
| 2010/0078658 A1* | 4/2010 | Lee et al. | 257/88 |
| 2010/0160589 A1* | 6/2010 | Asakawa et al. | 526/321 |
| 2010/0197055 A1 | 8/2010 | Tanaka et al. | |
| 2010/0261301 A1 | 10/2010 | Kusunoki | |
| 2011/0049735 A1* | 3/2011 | Sakuma et al. | 264/1.24 |
| 2011/0057553 A1* | 3/2011 | Ogawa | 313/116 |
| 2011/0100966 A1 | 5/2011 | Nagatomo et al. | |
| 2011/0248310 A1* | 10/2011 | Cheng et al. | 257/99 |
| 2012/0090673 A1* | 4/2012 | Dimitrov et al. | 136/255 |
| 2012/0134133 A1* | 5/2012 | Kang | 362/84 |
| 2012/0250304 A1* | 10/2012 | Harbers et al. | 362/231 |

FOREIGN PATENT DOCUMENTS

| | | | |
|---|---|---|---|
| JP | 2004-006662 A | | 1/2004 |
| JP | 2004-165227 A | | 6/2004 |
| JP | 2005-303286 A | | 10/2005 |
| JP | 2007-294566 A | | 11/2007 |
| JP | 2009-038407 A | | 2/2009 |
| JP | 2009-059969 A | | 3/2009 |
| JP | 2010-278145 A | | 12/2010 |
| JP | 2011-077562 A | | 4/2011 |
| JP | 2011-092970 A | | 5/2011 |
| KR | 2005049730 A | * | 5/2005 |
| KR | 2008029571 A | * | 4/2008 |
| WO | WO 2009143229 A1 | * | 11/2009 |

* cited by examiner

SEMICONDUCTOR LIGHT EMITTING ELEMENT HAVING A PLURALITY OF SUBSTRATE CUTOUTS AND SEMICONDUCTOR LAYER SIDE SURFACE PROJECTIONS

TECHNICAL FIELD

The present invention relates to a semiconductor light emitting element, a method for producing the light emitting element and a light emitting device.

BACKGROUND ART

There is known a semiconductor light emitting element, in which a semiconductor layer including an n-type semiconductor layer, a light emitting layer and a p-type semiconductor layer that are composed of a group III nitride semiconductor or the like is laminated on a substrate composed of sapphire single crystal or the like.

In such a semiconductor light emitting element, there exists a technique for suppressing multiple reflections of light within the semiconductor layer and improving light extraction efficiency in the semiconductor light emitting element by providing projections and depressions on a side surface of the semiconductor layer to cause light emitted from the light emitting layer to be irregularly reflected by the projections and depressions (refer to Patent Document 1).

CITATION LIST

Patent Literature

Patent Document 1: Japanese Patent Application Laid-Open Publication No. 2004-6662

SUMMARY OF INVENTION

Technical Problem

However, in the semiconductor light emitting element, in addition to the case of providing the projections and depressions on the side surface of the semiconductor layer, it is required to further improve the light extraction efficiency.

The present invention has an object to improve light extraction efficiency in a semiconductor light emitting element including a substrate.

Solution to Problem

A semiconductor light emitting element to which the present invention is applied is a semiconductor light emitting element having a substrate and a semiconductor layer, which includes a light emitting layer that emits light by current flow and is laminated on the substrate. The substrate includes a substrate top surface on which the semiconductor layer is laminated, a substrate bottom surface provided on an opposite side of the substrate top surface, and a substrate side surface formed to enclose limbs of the substrate top surface and the substrate bottom surface, and is provided with plural cutouts, which are formed by cutting out a part of the substrate and are arranged at intervals along a border between the substrate top surface and the substrate side surface; the semiconductor layer includes a semiconductor bottom surface provided in contact with the substrate top surface, a semiconductor top surface provided on an opposite side of the semiconductor bottom surface, and a semiconductor side surface provided to enclose limbs of the semiconductor bottom surface and the semiconductor top surface; and on the semiconductor side surface, projections and depressions are formed by arranging plural depressing portions, each of which extends from a semiconductor bottom surface side toward a semiconductor top surface side, and depresses toward an inside of the semiconductor layer.

Here, the semiconductor layer has a first semiconductor layer provided between the substrate and the light emitting layer, and a second semiconductor layer that includes the light emitting layer and is provided on the first semiconductor layer, and the plural depressing portions are provided in a region where the first semiconductor layer of the semiconductor side surface is exposed.

Moreover, the semiconductor side surface is provided to be inclined with respect to a direction vertical to the substrate top surface.

Further, an angle formed by the semiconductor bottom surface and the semiconductor side surface is larger than 90 degrees.

Then, a horizontal cross-sectional shape of the depressing portion is different between the semiconductor bottom surface side and the semiconductor top surface side.

Moreover, a curvature of the depressing portion on the semiconductor bottom surface side is smaller than a curvature of the depressing portion on the semiconductor top surface side.

Further, a curvature of the depressing portion on the semiconductor bottom surface side is substantially equal to a curvature of the depressing portion on the semiconductor top surface side, and a central axis of the depressing portion is different between the semiconductor bottom surface side and the semiconductor top surface side.

Then, in the semiconductor side surface, the projections and depressions are formed larger on the semiconductor top surface side in the semiconductor side surface than on the semiconductor bottom surface side in the semiconductor side surface.

Moreover, the substrate side surface includes a first substrate side surface along a first direction and a second substrate side surface along a second direction intersecting the first direction, the plural cutouts are arranged along the first direction with first intervals at a border between the substrate top surface and the first substrate side surface, and the plural cutouts are arranged along the second direction with second intervals at a border between the substrate top surface and the second substrate side surface, the semiconductor side surface includes a first semiconductor side surface along the first direction and a second semiconductor side surface along the second direction, on the first semiconductor side surface, the plural depressing portions are arranged, each of which corresponds to each of the plural cutouts arranged at the border between the substrate top surface and the first substrate side surface, on the second semiconductor side surface, the plural depressing portions are arranged, each of which corresponds to each of the plural cutouts arranged at the border between the substrate top surface and the second substrate side surface, and the depressing portions arranged on the first semiconductor side surface and the depressing portions arranged on the second semiconductor side surface are different in shape.

Further, projections and depressions are formed on the substrate top surface.

From another viewpoint, a method for producing a semiconductor light emitting element, to which the present invention is applied, includes: a laser irradiation process that sequentially irradiates a semiconductor lamination substrate, in which a semiconductor layer including a light emitting layer that emits light by current flow is laminated on a top surface of a substrate having the top surface and a bottom surface provided on an opposite side of the top surface, with laser light from a side where the semiconductor layer is laminated, to thereby form plural openings, each of which penetrates the semiconductor layer and is formed by cutting out a part of the substrate, arranged with an interval to the adjacent opening; an etching process that applies wet etching to the semiconductor layer in the semiconductor lamination substrate, in which the plural openings are formed; and a dividing process that divides the semiconductor lamination substrate along an arrangement of the plural openings.

Here, in the etching process, the wet etching is applied to the semiconductor layer so that the adjacent openings are united together.

Moreover, prior to the laser irradiation process, a protecting film forming process that forms a protecting film on the semiconductor layer is further included, and in the laser irradiation process, the semiconductor lamination substrate, on which the protecting film is formed, is irradiated with laser light from a side where the protecting film is formed so that the laser light reaches the top surface of the substrate through the protecting film and the semiconductor layer, and in the etching process, the wet etching is applied to the semiconductor layer in the semiconductor lamination substrate with the protecting film being formed on the semiconductor layer.

Further, the laser irradiation process includes: a first laser irradiation process that sequentially irradiates the semiconductor lamination substrate, in which the semiconductor layer containing a group III nitride is laminated on the top surface configured with a C-plane of a sapphire single crystal, with laser light in a first direction along an M-plane of the sapphire single crystal, to thereby form the plural openings arranged with first intervals along the first direction; and a second laser irradiation process that sequentially irradiates the semiconductor lamination substrate with laser light in a second direction intersecting the first direction, to thereby form the plural openings arranged with second intervals along the second direction.

Then, a semiconductor laminating process that laminates the semiconductor layer on the top surface of the substrate, on which a process for forming projections and depressions is applied, to thereby form the semiconductor lamination substrate is further included.

From another viewpoint, a light emitting device, to which the present invention is applied, includes a semiconductor light emitting element having a substrate and a semiconductor layer, which includes a light emitting layer that emits light by passing a current and is laminated on the substrate; and an electrical power supply member that supplies electrical power to the semiconductor light emitting element, wherein the substrate includes a substrate top surface on which the semiconductor layer is laminated, a substrate bottom surface provided on an opposite side of the substrate top surface and a substrate side surface formed to enclose limbs of the substrate top surface and the substrate bottom surface, and is provided with plural cutouts, which are formed by cutting out a part of the substrate and are arranged at intervals along a border between the substrate top surface and the substrate side surface, the semiconductor layer includes a semiconductor bottom surface provided in contact with the substrate top surface, a semiconductor top surface provided on an opposite side of the semiconductor bottom surface and a semiconductor side surface provided to enclose limbs of the semiconductor bottom surface and the semiconductor top surface, and the semiconductor side surface includes plural depressing portions, each of which extends from a semiconductor bottom surface side toward a semiconductor top surface side, and depresses toward an inside of the semiconductor layer.

Here, an angle formed by the semiconductor bottom surface and the semiconductor side surface is larger than 90 degrees, and the semiconductor light emitting element extracts light from the semiconductor top surface side in the semiconductor layer.

Advantageous Effects of Invention

According to the present invention, it is possible to improve the light extraction efficiency in the semiconductor light emitting element including the substrate.

DESCRIPTION OF EMBODIMENTS

Figure 1:
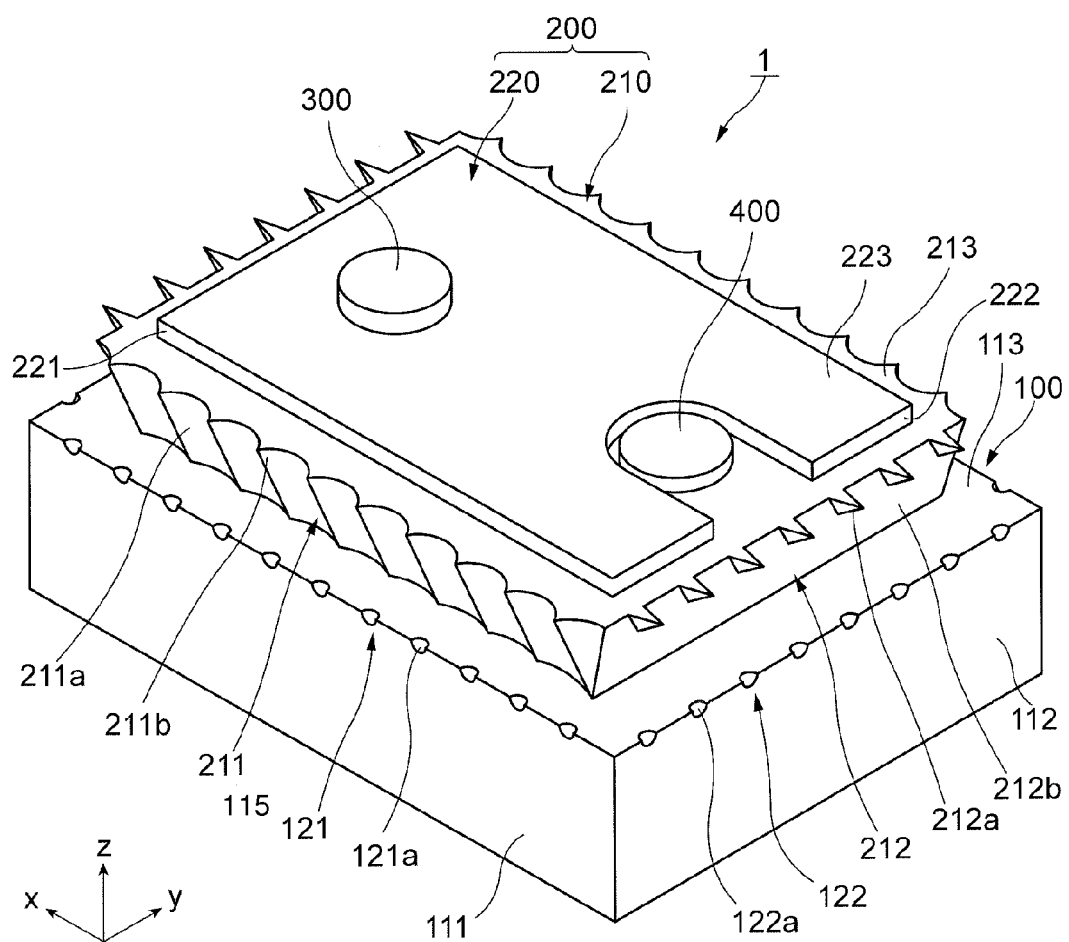
FIG. 1 is an example of a perspective view of a semiconductor light emitting element to which the exemplary embodiment is applied.

Hereinafter, exemplary embodiments according to the present invention will be described in detail with reference to accompanying drawings. It should be noted that there are some cases where a size or a thickness of each component in the drawings that are referred to in the description below is different from a dimension of an actual semiconductor light emitting element or the like.

Exemplary Embodiment 1

(Configuration of Semiconductor Light Emitting Element)

Figure 2:
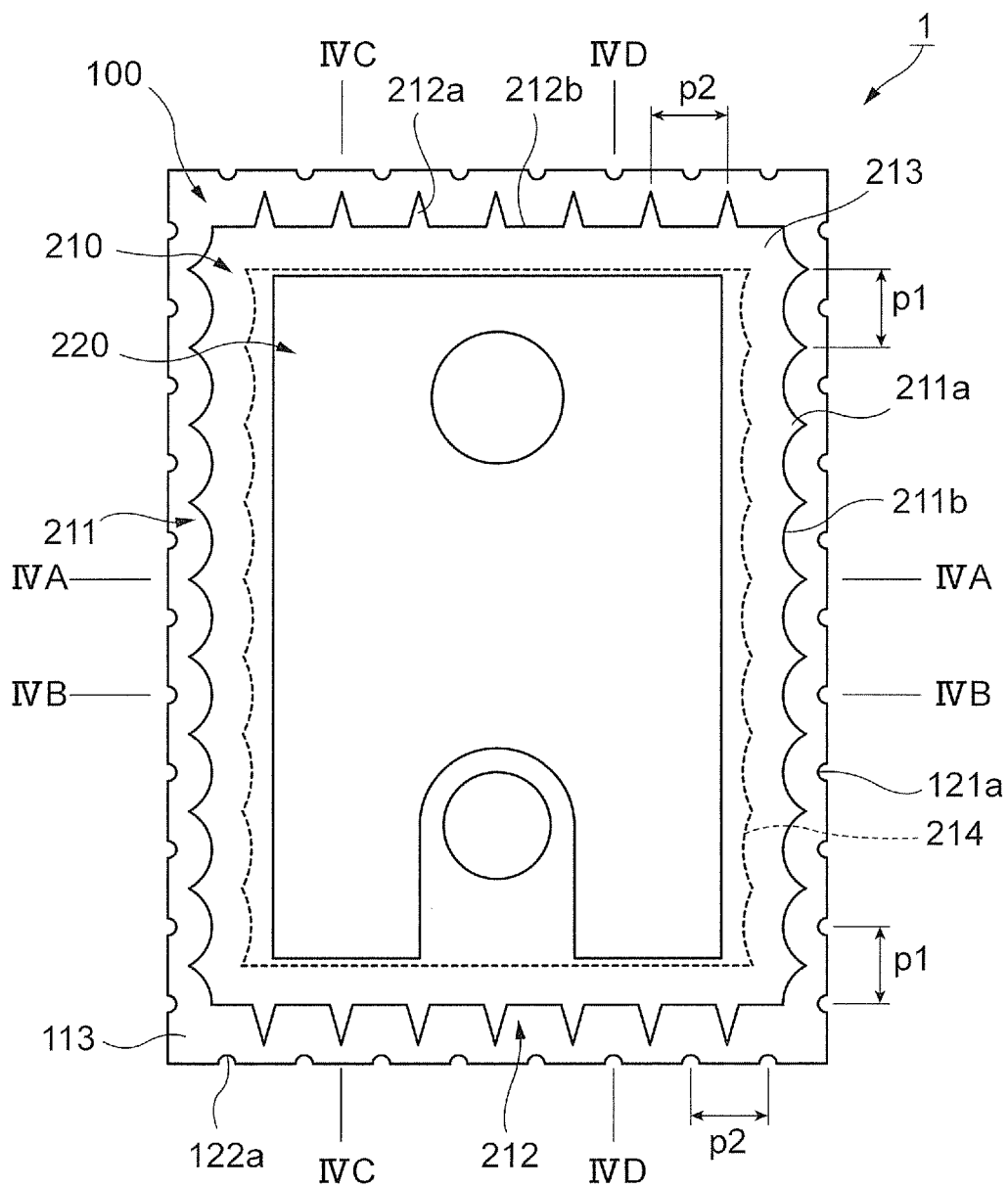
FIG. 2 is an example of a top view of the semiconductor light emitting element shown in FIG. 1.

FIG. 1 is an example of a perspective view of a semiconductor light emitting element 1 to which this exemplary embodiment is applied, and FIG. 2 is an example of a top view of the semiconductor light emitting element 1 shown in FIG. 1.

As shown in FIGS. 1 and 2, the semiconductor light emitting element 1 of the exemplary embodiment includes: a sapphire substrate 100 as an example of a substrate; a laminated semiconductor layer 200 laminated on the sapphire substrate 100 as an example of a semiconductor layer; and a p-electrode 300 and an n-electrode 400 formed on the laminated semiconductor layer 200. In addition, the laminated semiconductor layer 200 of the exemplary embodiment includes a lower semiconductor layer 210 laminated on the sapphire substrate 100 as an example of a first semiconductor layer and an upper semiconductor layer 220 laminated on the lower semiconductor layer 210 as an example of a second semiconductor layer. It should be noted that, in this specific example, the p-electrode 300 is formed on the upper semiconductor layer 220 and the n-electrode 400 is formed on the lower semiconductor layer 210.

Moreover, as shown in FIG. 1, the semiconductor light emitting element 1 of the exemplary embodiment has a shape that is substantially a rectangular parallelepiped. Then, as shown in FIG. 2, the semiconductor light emitting element 1 has substantially a rectangle shape including long sides and short sides in a case of being viewed from a side where the p-electrode 300 and the n-electrode 400 are formed.

In the exemplary embodiment, in the case where the semiconductor light emitting element 1 is viewed from the side where the p-electrode 300 and the n-electrode 400 are formed, a direction along the long sides is regarded as a first direction x and a direction along the short sides is regarded as a second direction y. Moreover, a direction that is perpendicular to the first direction x and the second direction y, and proceeds from the sapphire substrate 100 side toward the laminated semiconductor layer 200 side within the semiconductor light emitting element 1 is regarded as a third direction z.

Further, as shown in FIG. 1, the sapphire substrate 100 of the exemplary embodiment has a shape that is substantially a rectangular parallelepiped. Then, as shown in FIG. 2, the sapphire substrate 100 has substantially a rectangle shape including long sides along the first direction x and short sides along the second direction y in a case of being viewed from a side where the laminated semiconductor layer 200 is laminated. Consequently, the sapphire substrate 100 includes four substrate side surfaces, a substrate top surface 113 on which the laminated semiconductor layer 200 is laminated, and a substrate bottom surface 114 facing the substrate top surface 113 via the four substrate side surfaces (refer to FIG. 3 to be described later). Then, each of the substrate top surface 113 and the substrate bottom surface 114 has a rectangular shape including two long sides along the first direction x and two short sides along the second direction y.

Moreover, in the exemplary embodiment, of the four substrate side surfaces, each of two substrate side surfaces on the two long sides along the first direction x is referred to as a first substrate side surface 111, and each of two substrate side surfaces on the two short sides along the second direction y is referred to as a second substrate side surface 112.

In this specific example, as the sapphire substrate 100, a sapphire single crystal in which a C-plane is assumed to be the substrate top surface 113 is used. It should be noted that, as a plane direction of the substrate top surface 113, it is desirable to use the C-plane of a sapphire single crystal that is likely to obtain the laminated semiconductor layer 200 with good quality. Then, as the substrate top surface 113, it is further desirable to use a plane that is provided with a minute off angle with respect to the C-plane of the sapphire single crystal. In the case of providing the off angle, 1 degree or less is applied as the off angle. In the exemplary embodiment, it is simply said that the substrate top surface 113 is a C-plane, including the case where the off angle is provided. Further, the sapphire single crystal used as the sapphire substrate 100 may contain trace amounts of impurities.

Further, each of the two first substrate side surfaces 111 in the sapphire substrate 100 is provided along an M-plane of the sapphire single crystal used as the sapphire substrate 100, and each of the two second substrate side surfaces 112 is provided along an A-plane of the sapphire single crystal. In other words, in the exemplary embodiment, the first direction x is a direction along the M-plane of the sapphire single crystal, and the second direction y is a direction along the A-plane of the sapphire single crystal.

It should be noted that, as a substrate for growing the laminated semiconductor layer 200, other than the sapphire substrate 100 composed of the sapphire single crystal, SiC single crystal substrate may be used.

Moreover, as shown in FIGS. 1 and 2, the lower semiconductor layer 210 of the exemplary embodiment has a shape that is substantially a rectangular parallelepiped. Accordingly, the lower semiconductor layer 210 includes: four lower semiconductor side surfaces; a lower semiconductor top surface 213 on which the upper semiconductor layer 220 and the n-electrode 400 are laminated; and a lower semiconductor bottom surface 214, as an example of a semiconductor bottom surface, that faces the lower semiconductor top surface 213 via the four lower semiconductor side surfaces and contacts the substrate top surface 113. In the exemplary embodiment, of the four lower semiconductor side surfaces in the lower semiconductor layer 210, each of two lower semiconductor side surfaces along the first direction x is referred to as a first lower semiconductor side surface 211, and each of two lower semiconductor side surfaces along the second direction y is referred to as a second lower semiconductor side surface 212.

Here, in the exemplary embodiment, the area of the lower semiconductor bottom surface 214 in the lower semiconductor layer 210 is formed smaller than the area of the substrate top surface 113 in the sapphire substrate 100. Consequently, the limb (or peripheral edge) portion 115 in the substrate top surface 113 of the sapphire substrate 100 is exposed to the outside.

In addition, in this specific example, the area of the lower semiconductor bottom surface 214 is formed smaller than the area of the lower semiconductor top surface 213 in the lower semiconductor layer 210.

Further, as shown in FIGS. 1 and 2, the upper semiconductor layer 220 of the exemplary embodiment has a shape that is substantially a rectangular parallelepiped. Accordingly, the upper semiconductor layer 220 includes: four upper semiconductor side surfaces; an upper semiconductor top surface 223, as an example of a semiconductor top surface, on which the p-electrode 300 is laminated; and an upper semiconductor bottom surface (not shown) that faces the upper semiconductor top surface 223 via the four upper semiconductor side surfaces and contacts the lower semiconductor top surface 213 in the lower semiconductor layer 210. In the exemplary embodiment, of the four upper semiconductor side surfaces in the upper semiconductor layer 220, each of two upper semiconductor side surfaces along the first direction x is referred to as a first upper semiconductor side surface 221, and each of two upper semiconductor side surfaces along the second direction y is referred to as a second upper semiconductor side surface 222. It should be noted that one second upper semiconductor side surface 222 of the two second upper semiconductor side surfaces 222 has a portion that curves like an arc along the n-electrode 400 provided on the lower semiconductor layer 210.

In the exemplary embodiment, each of the two first upper semiconductor side surfaces 221 and the two second upper semiconductor side surfaces 222 are provided substantially vertical to the lower semiconductor top surface 213 in the lower semiconductor layer 210 (also refer to FIGS. 4A to 4D to be described later).

Here, in the exemplary embodiment, the area of the upper semiconductor bottom surface in the upper semiconductor layer 220 is formed smaller than the area of the lower semiconductor top surface 213 in the lower semiconductor layer 210. Consequently, the limb portion in the lower semiconductor top surface 213 of the lower semiconductor layer 210 is exposed to the outside.

It should be noted that the semiconductor side surfaces are constituted by the first lower semiconductor side surfaces 211, the second lower semiconductor side surfaces 212, the first upper semiconductor side surfaces 221 and the second upper semiconductor side surfaces 222. Moreover, first semiconductor side surfaces are constituted by the first lower semiconductor side surfaces 211 and the first upper semiconductor side surfaces 221, and second semiconductor side surfaces are constituted by the second lower semiconductor side surfaces 212 and the second upper semiconductor side surfaces 222.

In the sapphire substrate 100 of the exemplary embodiment, a first cutout row 121 is formed along the first direction x at a border portion between the first substrate side surface 111 and the substrate top surface 113. The first cutout row 121 is, at the border portion between the first substrate side surface 111 and the substrate top surface 113, configured by plural first cutouts 121a, as an example of cutouts that are formed by cutting out a part of the sapphire substrate 100, arranged along the first direction x. Here, a distance between the adjacent first cutouts 121a is a first pitch p1.

Similarly, in the sapphire substrate 100 of the exemplary embodiment, a second cutout row 122 is formed along the second direction y at a border portion between the second substrate side surface 112 and the substrate top surface 113. The second cutout row 122 is, at the border portion between the second substrate side surface 112 and the substrate top surface 113, configured by plural second cutouts 122a, as an example of the cutouts that are formed by cutting out a part of the sapphire substrate 100, arranged along the second direction y. Here, a distance between the adjacent second cutouts 122a is a second pitch p2.

In addition, the depth of the first cutouts 121a and the second cutouts 122a is in the range of 0.1 μm to 20 μm.

It should be noted that, in the exemplary embodiment, the first pitch p1 and the second pitch p2 are equal (p1=p2).

Moreover, the first lower semiconductor side surface 211 in the lower semiconductor layer 210 of the exemplary embodiment includes plural first depressing portions 211b that extend along the third direction z and depress toward the inside of the lower semiconductor layer 210 and plural first projecting portions 211a that extend along the third direction z and project toward the outside of the lower semiconductor layer 210 compared to the first depressing portions 211b. Then, the plural first depressing portions 211b and the plural first projecting portions 211a are alternately arranged along the first direction x, and thereby a shape of depressions and projections that periodically changes along the first direction x is formed on the first lower semiconductor side surface 211. Here, in this specific example, a distance between the adjacent first projecting portions 211a is the first pitch p1.

Further, the second lower semiconductor side surface 212 in the lower semiconductor layer 210 of the exemplary embodiment is provided with second flat portions 212b that are formed substantially flat along the second direction y and the third direction z, and plural second protruding portions 212a that are provided on the upper semiconductor layer 220 side of the second flat portions 212b, protruding toward the outside of the lower semiconductor layer 210 compared to the second flat portions 212b, and arranged along the second direction. Then, on the second lower semiconductor side surface 212, a shape of depressions and projections that periodically changes along the second direction y is formed by the first protruding portions 212a and the second flat portions 212b. Here, a distance between the adjacent second protruding portions 212a is the second pitch p2.

It should be noted that, in the exemplary embodiment, depressing portions are configured with the first depressing portions 211b in the first lower semiconductor side surface 211 and the second flat portions 212b in the second lower semiconductor side surface 212.

In the exemplary embodiment, the projections and depressions formed in the first lower semiconductor side surface 211 and the projections and depressions formed in the second lower semiconductor side surface 212 are different in shape.

The shape of the projections and depressions in the first lower semiconductor side surface 211 and second lower semiconductor side surface 212 in the lower semiconductor layer 210 will be described in detail in a later stage.

It should be noted that, in this specific example, the shape of projections and depressions is not formed on the first upper semiconductor side surface 221 and the second upper semiconductor side surface 222 in the upper semiconductor layer 220 including an n-cladding layer 203b, a light emitting layer 204 and a p-type semiconductor layer 205.

Subsequently, a laminated structure of the sapphire substrate 100 and the laminated semiconductor layer 200 in the semiconductor light emitting element 1 of the exemplary embodiment will be described.

Figure 3:
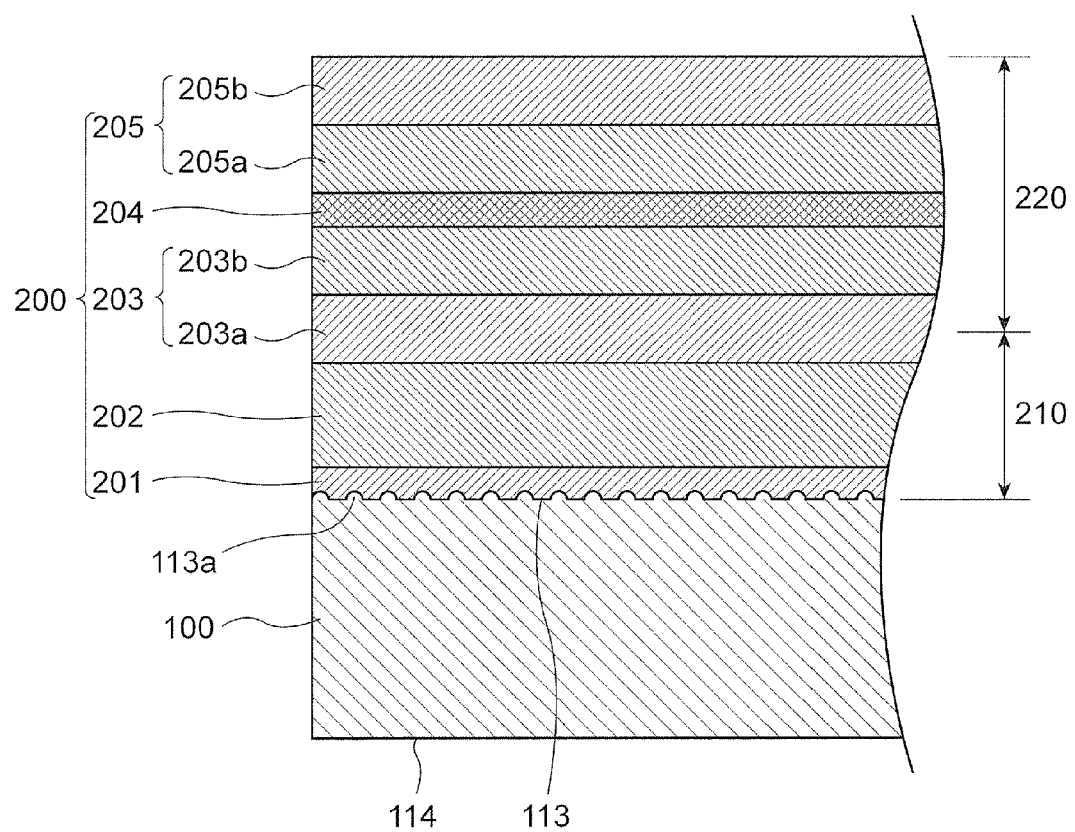
FIG. 3 is an example of a vertical cross-sectional view of a sapphire substrate and a laminated semiconductor layer in the exemplary embodiment.

FIG. 3 is an example of a vertical cross-sectional view of the sapphire substrate 100 and the laminated semiconductor layer 200 in the exemplary embodiment. It should be noted that, in the exemplary embodiment, a cross section along the direction vertical to the substrate top surface 113 of the sapphire substrate 100 is referred to as a vertical cross section, and a cross section along the direction in parallel with the substrate top surface 113 is referred to as a horizontal cross section.

As shown in FIG. 3, in the sapphire substrate 100 of the exemplary embodiment, plural projecting portions 113a projecting toward the laminated semiconductor layer 200 side are formed on the flat substrate top surface 113. The width of each projecting portion 113a is preferably 0.05 μm to 5 μm, and the height of each projecting portion 113a is preferably in the range of 0.05 μm to 5 μm. In addition, it is preferable that the pitch between the adjacent projecting portions 113a is smaller than the first pitch p1 (refer to FIG. 2) and the second pitch p2 (refer to FIG. 2).

It should be noted that, though the projecting portions 113a are not necessarily provided on the substrate top surface 113 of the sapphire substrate 100; however, from the viewpoint for improving crystallinity of the laminated semiconductor layer 200 laminated on the sapphire substrate 100 and light extraction efficiency of the semiconductor light emitting element 1, it is preferable to provide the plural projecting portions 113a on the substrate top surface 113. Further, from the viewpoint of forming the projections and depressions on the first lower semiconductor side surface 211 and the second lower semiconductor side surface 212 of the lower semiconductor layer 210, it is preferable to provide the plural projecting portions 113a on the substrate top surface 113 of the sapphire substrate 100.

Moreover, as shown in FIG. 3, the laminated semiconductor layer 200 in the exemplary embodiment is laminated on the substrate top surface 113 of the sapphire substrate 100 and on the projecting portions 113a formed on the substrate top surface 113.

Then, the laminated semiconductor layer 200 of the exemplary embodiment includes: an intermediate layer 201 laminated on the sapphire substrate 100; a base layer 202 laminated on the intermediate layer 201; the n-type semiconductor layer 203 laminated on the base layer 202; the light emitting layer 204 laminated on the n-type semiconductor layer 203; and the p-type semiconductor layer 205 laminated on the light emitting layer 204. It should be noted that other layers such as a transparent conductive layer and a protecting layer may be laminated on the p-type semiconductor layer 205. In the exemplary embodiment, those including the layers such as the transparent conductive layer and the protecting layer laminated on the p-type semiconductor layer 205 are referred to as the laminated semiconductor layer 200.

The n-type semiconductor layer 203 is configured with the n-contact layer 203a laminated on the base layer 202 and the n-cladding layer 203b laminated on the n-contact layer 203a. It should be noted that the n-contact layer 203a can also serve as the n-cladding layer 203b.

Moreover, the p-type semiconductor layer 205 is configured with a p-cladding layer 205a laminated on the light emitting layer 204 and a p-contact layer 205b laminated on the p-cladding layer 205a. It should be noted that the p-contact layer 205b can also serve as the p-cladding layer 205a.

It should be noted that, in the exemplary embodiment, the lower semiconductor layer 210 is configured with the intermediate layer 201, the base layer 202 and a part of the n-contact layer 203a on the base layer 202 side. Further, the upper semiconductor layer 220 is configured with a part of the n-contact layer 203a on the n-cladding layer 203b side, the n-cladding layer 203b, the light emitting layer 204, the p-cladding layer 205a and the p-contact layer 205b.

Subsequently, each layer constituting the laminated semiconductor layer 200 will be described.

It should be noted that, in the following description, AlGaN, GaN and GaInN are described with the compositional ratio of each element being omitted in some cases.

<Intermediate Layer>

The intermediate layer 201 mediates the difference in lattice constant between the sapphire substrate 100 and the base layer 202, and in particular, in the case where the sapphire substrate 100 is configured with a sapphire single crystal in which the C-plane is a principal plane, has a function of facilitating the formation of a single crystal layer which is c-axis oriented on a (0001) plane (C-plane) of the sapphire substrate 100. Consequently, by forming the intermediate layer 201, it is possible to improve crystallinity of the base layer 202 to be laminated thereon.

The intermediate layer 201 of the exemplary embodiment is formed of AlN. It should be noted that, as the intermediate layer 201, other than AlN, those composed of polycrystal $Al_xGa_{1-x}N$ ($0 \le x \le 1$) or single crystal $Al_xGa_{1-x}N$ ($0 \le x \le 1$) may be used.

The thickness of the intermediate layer 201 is preferably in the range of 0.01 µm to 0.5 µm. If the thickness of the intermediate layer 201 is less than 0.01 µm, there are some cases where an effect of the intermediate layer 201 to mediate the difference in lattice constant between the sapphire substrate 100 and the base layer 202 cannot be sufficiently obtained. Moreover, if the thickness of the intermediate layer 201 is more than 0.5 µm, there is a possibility that the time of forming process of the intermediate layer 201 becomes longer though there is no change to the function of the intermediate layer 201, and accordingly the productivity is decreased.

<Base Layer>

As the base layer 202, $Al_xGa_yIn_zN$ ($0 \le x \le 1$, $0 \le y \le 1$, $0 \le z \le 1$, $x+y+z=1$) can be used.

The thickness of the base layer 202 is preferably 0.1 µm or more, more preferably 0.5 µm or more, and most preferably 1 µm or more. The base layer 202 having good crystallinity is likely to be obtained by setting the thickness of the base layer 202 to be 1 µm or more.

Moreover, to improve the crystallinity of the base layer 202, it is desirable that the base layer 202 is not doped with impurities. However, in the case where conductivity of p-type or n-type is needed, acceptor impurities or donor impurities can be added.

Further, for causing the first lower semiconductor side surface 211 (refer to FIG. 1) and the second lower semiconductor side surface 212 (refer to FIG. 1) to be inclined with respect to the direction vertical to the lower semiconductor bottom surface 214 and to be in different shapes of projections and depressions between the lower semiconductor top surface 213 side and the lower semiconductor bottom surface 214 side, it is desirable that the material of the intermediate layer 201 and the material of the base layer 202 are different. By difference between the material of the intermediate layer 201 and the material of the base layer 202, in an etching process (refer to FIG. 7) in the method for producing the semiconductor light emitting element to be described later, an etching shape and easiness in etching of the lower semiconductor layer 210 are likely to become different between the lower semiconductor top surface 213 side and the lower semiconductor bottom surface 214 side. As suitable examples of the intermediate layer 201 and the base layer 202, a material containing AlGaN can be used as the intermediate layer 201 and a material containing GaN and InGaN can be used as the base layer 202. In addition, a dopant may be added to the intermediate layer 201 or the base layer 202. In this case, it is desirable to change the kinds or a doping amount of the dopant to be added between the intermediate layer 201 and the base layer 202.

<N-Contact Layer>

The n-contact layer 203a is a layer for providing the n-electrode 400.

The n-contact layer 203a is preferably configured with the $Al_xGa_{1-x}N$ layer ($0 \le x < 1$, more preferably $0 \le x \le 0.5$, and still more preferably $0 \le x \le 0.1$).

Further, the n-contact layer 203a is preferably doped with n-type impurities. It is preferable to contain the n-type impurities having a concentration of $1 \times 10^{17}/cm^3$ to $1 \times 10^{20}/cm^3$, and a concentration of $1\times10^{18}/cm^3$ to $1\times10^{19}/cm^3$ is more preferable on the point that a good ohmic contact with the n-electrode 400 can be maintained. As the n-type impurities, Si, Ge, Sn and so on are provided, and Si and Ge are preferably provided.

The thickness of the n-contact layer 203a is preferably set to 0.5 μm to 5 μm, and more preferably set in the range of 1 μm to 3 μm. If the thickness of the n-contact layer 203a is in the above-described ranges, crystallinity of the light emitting layer 204 or the like is suitably maintained. Moreover, if the thickness of the n-contact layer 203a is in the above-described ranges, electrical resistance is reduced, to thereby produce an effect of reducing an operation voltage (VF). It should be noted that the case where the thickness of the n-contact layer 203a is excessively thick will lead to decrease of productivity.

<N-Cladding Layer>

The n-cladding layer 203b performs injection of the carriers into the light emitting layer 204 and confinement of the carriers.

The n-cladding layer 203b can be formed of AlGaN, GaN, GaInN and so on. The hetero junction of these structures or the superlattice structure, in which the layer is laminated plural times, may also be used. In the case where the n-cladding layer 203b is formed of GaInN, the band gap thereof is preferably larger than that of GaInN of the light emitting layer 204.

The n-type impurity concentration of the n-cladding layer 203b is preferably in the range of $1\times10^{17}/cm^3$ to $1\times10^{20}/cm^3$, and more preferably in the range of $1\times10^{18}/cm^3$ to $1\times10^{19}/cm^3$. It is preferable to provide the impurity concentration in these ranges in terms of maintaining excellent crystallinity and reducing operation voltage of the element.

The thickness of the n-cladding layer 203b is preferably in the range of 5 nm to 500 nm, and more preferably in the range of 50 nm to 200 nm.

It should be noted that, in the case where the n-cladding layer 203b is a layer containing the superlattice structure, the layer may contain a structure in which an n-side first layer composed of the group III nitride semiconductor with a thickness of 10 nm or less and an n-side second layer composed of the group III nitride semiconductor having a composition different from that of the n-side first layer and having a thickness of 10 nm or less are laminated.

Moreover, the n-cladding layer 203b may contain a structure in which the n-side first layers and the n-side second layers are alternately and repeatedly laminated, and in this case, the structure is preferably an alternating structure of GaInN and GaN or an alternating structure of GaInN having different compositions.

<Light Emitting Layer>

As the light emitting layer 204 to be laminated on the n-cladding layer 203b, a single quantum well structure or a multiple quantum well structure can be employed.

As a well layer having a quantum well structure, the group III nitride semiconductor layer composed of $Ga_{1-y}In_yN$ (0<y<0.4) that has been adjusted to be able to obtain desirable light emission wavelength is usually used. Moreover, in the case of employing the light emitting layer 204 having the multiple quantum well structure, the above-described $Ga_{1-y}In_yN$ is employed as the well layer, and $Al_zGa_{1-z}N$ (0≤z<0.3) having a band gap energy larger than that of the well layer is employed as a barrier layer. The well layer and the barrier layer may be doped or not doped with impurities depending upon a design thereof.

<P-Cladding Layer>

The p-cladding layer 205a performs confinement of carriers within the light emitting layer 204 and injection of carriers.

As the p-cladding layer 205a, there is no particular limitation as long as the band gap energy of the composition thereof is larger than that of the light emitting layer 204 and carriers can be confined within the light emitting layer 204, but, for example, $Al_xGa_{1-x}N$ (0<x≤0.4) is desirably used. It is preferable that the p-cladding layer 205a is composed of such AlGaN in terms of confinement of carriers within the light emitting layer 204.

The p-type impurity concentration of the p-cladding layer 205a is preferably $1\times10^{18}/cm^3$ to $1\times10^{21}/cm^3$, and more preferably $1\times10^{19}/cm^3$ to $1\times10^{20}/cm^3$. If the p-type impurity concentration is in the above ranges, good p-type crystals can be obtained without deteriorating crystallinity.

Further, similar to the above-described n-cladding layer 203b, the p-cladding layer 205a may have a superlattice structure. In this case, it is preferable to have an alternating structure of AlGaN and another AlGaN having different compositional ratio or an alternating structure of AlGaN and GaN having different composition.

The thickness of the p-cladding layer 205a is not particularly limited, but preferably 1 nm to 400 nm, and more preferably 5 nm to 100 nm.

<P-Contact Layer>

The p-contact layer 205b is a layer for providing the p-electrode 300. The p-contact layer 205b is preferably composed of $Al_xGa_{1-x}N$ (0≤x≤0.4). It is preferable that Al composition is in the above-described range in terms of allowing to maintain good crystallinity and good ohmic contact with the p-electrode 300. It should be noted that it is preferable to provide a transparent conductive layer composed of IZO, ITO and the like having excellent optical transparency and conductivity. By providing such a transparent conductive layer, current diffusion becomes favorable, to thereby lead to improvement of light emission output and reduction of the operation voltage.

The p-type impurity concentration of the p-contact layer 205b is preferably $1\times10^{18}/cm^3$ to $1\times10^{21}/cm^3$, and more preferably $5\times10^{19}/cm^3$ to $5\times10^{20}/cm^3$. It is preferable that the p-type impurity concentration is in the above ranges in a point that it becomes possible to maintain good ohmic contact and good crystallinity. As the p-type impurities, there is no particular limitation; however, for example, Mg can be provided.

The thickness of the p-contact layer 205b is not particularly limited, but is preferably 10 nm to 500 nm, and more preferably 50 nm to 200 nm. It is preferable to provide the thickness of the p-contact layer in these ranges in terms of the light emission output and the operation voltage.

Next, description will be given to detailed structures of the first lower semiconductor side surface 211 and the second lower semiconductor side surface 212 in the lower semiconductor layer 210.

Figure 4A:
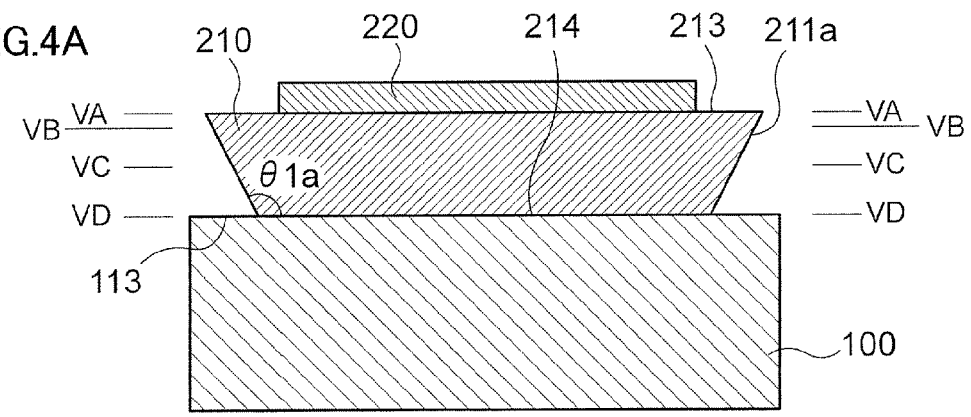
FIGS. 4A to 4D are examples of a vertical cross-sectional view of the semiconductor light emitting element to which the exemplary embodiment is applied.
Figure 4B:
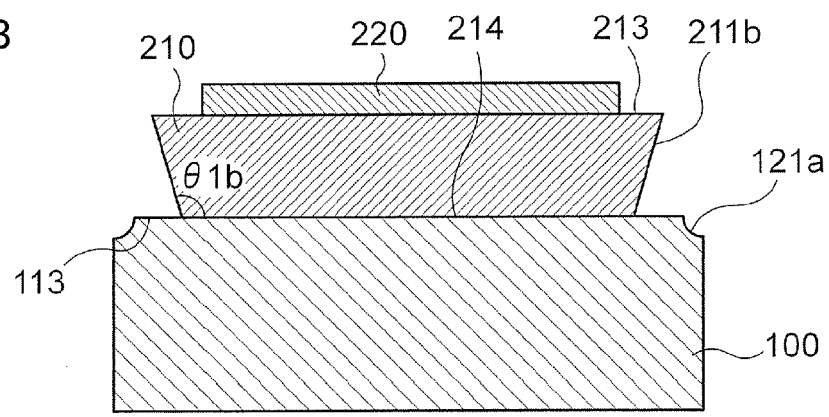
Figure 4C:
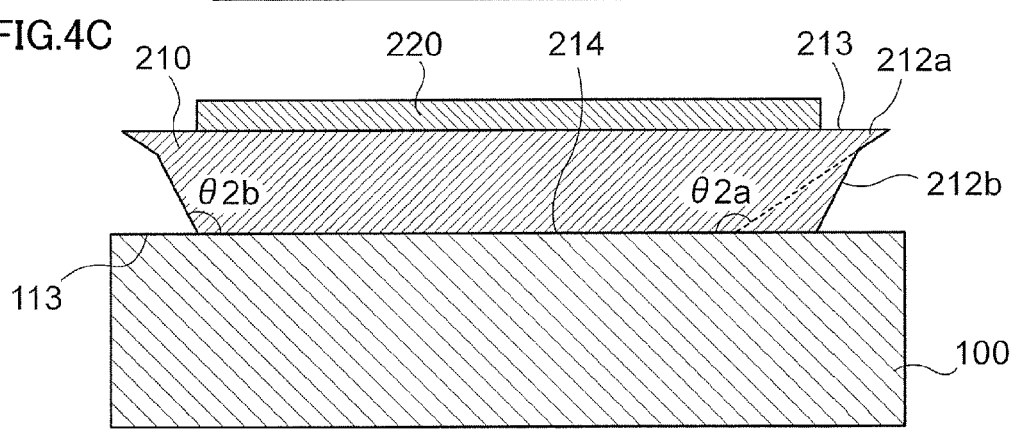
Figure 4D:
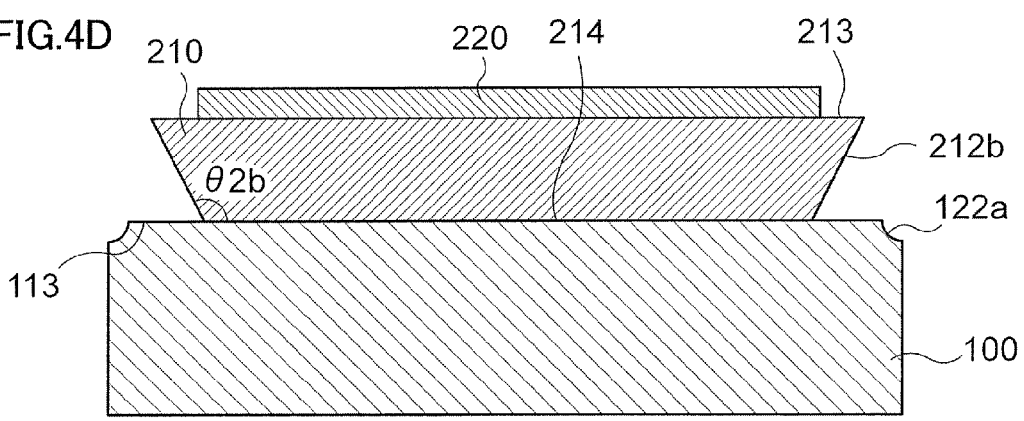

FIGS. 4A to 4D are examples of a vertical cross-sectional view of the semiconductor light emitting element 1 to which the exemplary embodiment is applied. Here, FIG. 4A is a IVA-IVA cross-sectional view of FIG. 2, and is a vertical cross-sectional view of a part of the first lower semiconductor side surface 211 of the lower semiconductor layer 210, in which the first projecting portion 211a exists. FIG. 4B is a IVB-IVB cross-sectional view of FIG. 2, and is a vertical cross-sectional view of a part of the first lower semiconductor side surface 211 of the lower semiconductor layer 210, in which the first depressing portion 211b exists. FIG. 4C is a IVC-IVC cross-sectional view of FIG. 2, and is a vertical cross-sectional view of a part of the second lower semiconductor side surface 212 of the lower semiconductor layer 210, in which the second protruding portion 212a exists. FIG. 4D is a IVD-IVD cross-sectional view of FIG. 2, and is a vertical cross-sectional view of a part of the second lower semiconductor side surface 212 of the lower semiconductor layer 210, in which the second flat portions 212b exist.

Figure 5A:
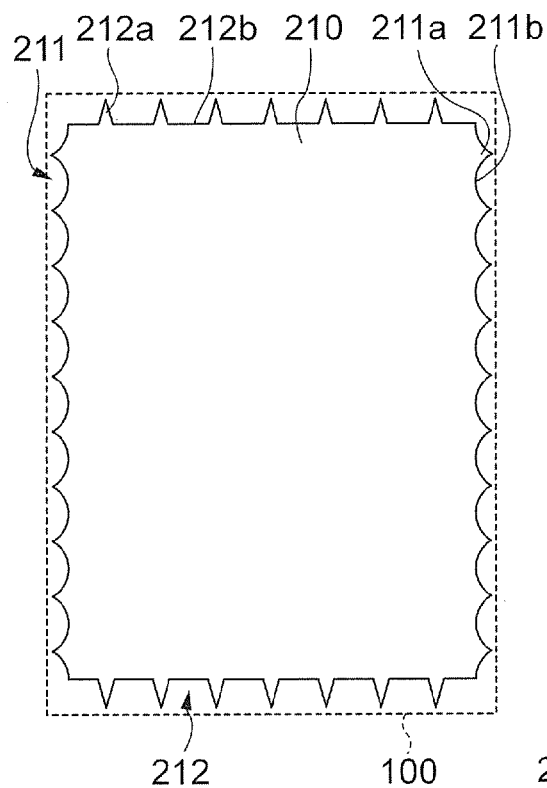
FIGS. 5A to 5D are examples of a horizontal cross-sectional view of the semiconductor light emitting element to which the exemplary embodiment is applied.
Figure 5B:
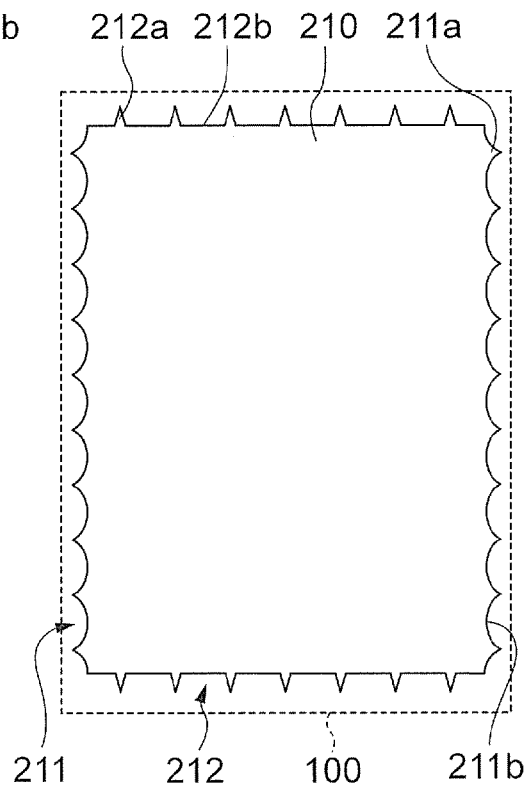
Figure 5C:
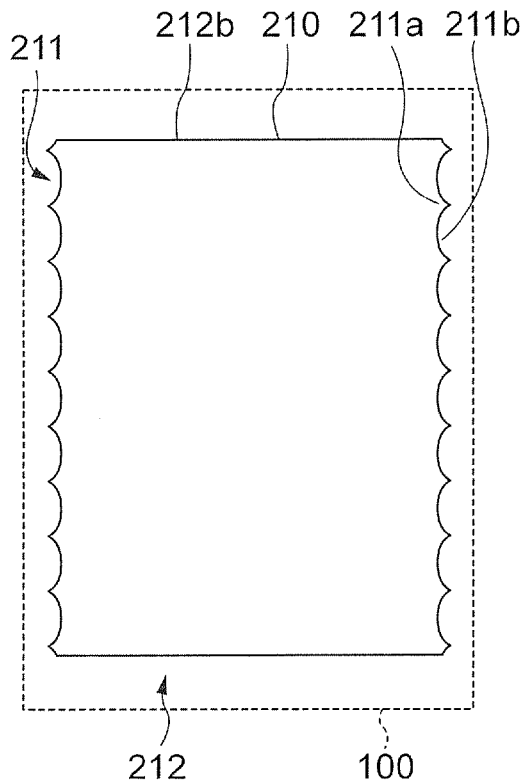
Figure 5D:
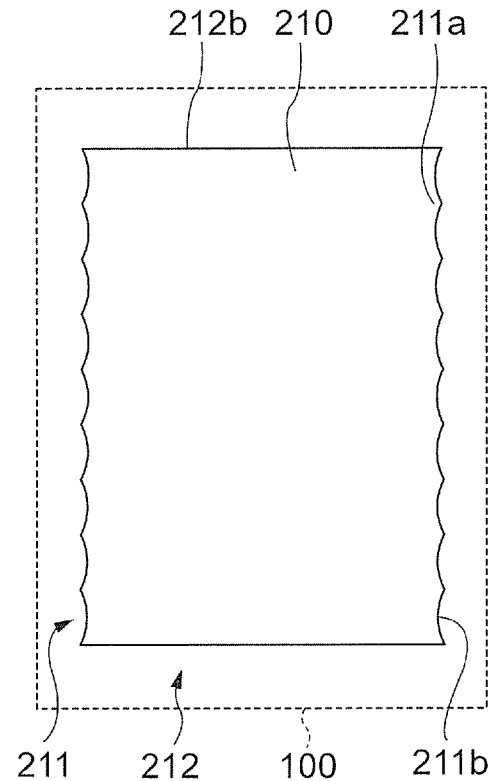

FIGS. 5A to 5D are examples of a horizontal cross-sectional view of the semiconductor light emitting element 1 to which the exemplary embodiment is applied. Here, FIG. 5A is a VA-VA cross sectional view of FIG. 4A, FIG. 5B is a VB-VB cross sectional view of FIG. 4A, FIG. 5C is a VC-VC cross sectional view of FIG. 4A, and FIG. 5D is a VD-VD cross sectional view of FIG. 4A.

First, the shape of the first lower semiconductor side surface 211 in the lower semiconductor layer 210 will be described.

As shown in FIG. 4A, in the lower semiconductor layer 210, the angle formed by the first lower semiconductor side surface 211 and the lower semiconductor bottom surface 214 in the first projecting portion 211a is assumed to be $\theta 1a$. In the exemplary embodiment, $\theta 1a$ is an obtuse angle ($\theta 1a > 90°$). In a similar way, as shown in FIG. 4B, in the lower semiconductor layer 210, the angle formed by the first lower semiconductor side surface 211 and the lower semiconductor bottom surface 214 in the first depressing portion 211b is assumed to be $\theta 1b$. In the exemplary embodiment, $\theta 1b$ is an obtuse angle ($\theta 1b > 90°$).

Moreover, in the exemplary embodiment, in each of the two first lower semiconductor side surfaces 211 facing each other, the distance to the facing first lower semiconductor side surface 211 is set to be gradually longer along with a move from the lower semiconductor bottom surface 214 side toward the lower semiconductor top surface 213 side along the third direction z.

Accordingly, in the exemplary embodiment, the first lower semiconductor side surface 211 has a shape inclined toward the outside of the lower semiconductor layer 210 with respect to a plane that is along the first direction x and is vertical to the substrate top surface 113.

Then, as shown in FIGS. 4A and 4B, $\theta 1a$ and $\theta 1b$ are different, and in the exemplary embodiment, $\theta 1a$ is formed larger than $\theta 1b$ ($\theta 1a > \theta 1b$). In other words, in the exemplary embodiment, the angle formed by the first lower semiconductor side surface 211 of the lower semiconductor layer 210 and the substrate top surface 213 is periodically varied along the first direction x.

Moreover, as shown in FIGS. 5A to 5D that are horizontal cross-sectional views, each of the horizontal cross sections of the first depressing portions 211b in the first lower semiconductor side surface 211 form an arc shape having a center of a circle outside of the lower semiconductor layer 210. By the plural first depressing portions 211b having the arc shape and being arranged in line along the first direction x, between the adjacent first depressing portions 211b, the first projecting portions 211a that project toward the outside than the first depressing portions 211b in the lower semiconductor layer 210 are formed. In other words, the horizontal cross section of the first lower semiconductor side surface 211 has a structure in which the arc-shaped first depressing portions 211b and the first projecting portions 211a that project toward the outside of the lower semiconductor layer 210 than the first depressing portions 211b are alternately and periodically arranged.

Further, as shown in FIGS. 5A to 5D, the horizontal cross-sectional shape of the first lower semiconductor side surface 211 changes along with a move from the lower semiconductor bottom surface 214 (refer to FIG. 4) side toward the lower semiconductor top surface 213 (refer to FIG. 4) side in the lower semiconductor layer 210 along the third direction z. Specifically, the curvature of the first depressing portion 211b in the first lower semiconductor side surface 211 becomes gradually larger along with a move from the lower semiconductor bottom surface 214 side toward the lower semiconductor top surface 213 side in the lower semiconductor layer 210.

It should be noted that the curvature means an amount indicating a degree of curving of a curved line; however, in the exemplary embodiment, a curvature in a circumscribed circle of a polygon is simply referred to as the curvature in some cases.

Furthermore, as shown in FIG. 4B and in the above-described FIG. 2, at a border portion between the substrate top surface 113 and the first substrate side surface 111 of the sapphire substrate 100, the first cutout 121a is formed at a region corresponding to the first depressing portion 211b of the first lower semiconductor side surface 211. In the exemplary embodiment, as shown in FIGS. 2 and 5A to 5D, each of the first depressing portions 211b in the first lower semiconductor side surface 211 forms an arc of a circle around the facing first cutout 121a when viewed from the direction vertical to the substrate top surface 113.

On the other hand, as shown in FIG. 4A and in the above-described FIG. 2, at the border portion between the substrate top surface 113 and the first substrate side surface 111 of the sapphire substrate 100, no cutout is formed at a region corresponding to the first projecting portion 211a of the first lower semiconductor side surface 211.

Subsequently, the shape of the second lower semiconductor side surface 212 in the lower semiconductor layer 210 will be described.

As shown in the above-described FIG. 1, the second flat portions 212b are provided in the entire region of the second lower semiconductor side surface 212 except for the region where the plural second protruding portions 212a are formed.

The angle formed by the second flat portion 212b in the second lower semiconductor side surface 212 and the substrate top surface 113 of the sapphire substrate 100 is assumed to be $\theta 2b$. In the exemplary embodiment, $\theta 2b$ is an obtuse angle ($\theta 2b > 90°$).

Moreover, in the exemplary embodiment, in each of the two second lower semiconductor side surfaces 212 facing each other, the distance to the facing second lower semiconductor side surface 212 is set to be gradually longer along with a move from the lower semiconductor bottom surface 214 side toward the lower semiconductor top surface 213 side along the third direction z.

Accordingly, in the exemplary embodiment, the second lower semiconductor side surface 212 has a shape inclined toward the outside of the lower semiconductor layer 210 with respect to a plane that is along the second direction y and is vertical to the substrate top surface 113.

Moreover, as shown in FIG. 4C, the angle formed by a surface on the substrate side of the second protruding portion 212a and the substrate top surface 113 of the sapphire substrate 100 is assumed to be $\theta 2a$. In the exemplary embodiment, $\theta 2a$ is an obtuse angle ($\theta 2a > 90°$). This makes the height of the second protruding 212a protruding from the second flat portion 212b be reduced along with a move from the lower semiconductor top surface 213 side toward the lower semiconductor bottom surface 214 side along the direction opposite to the third direction z.

Then, as shown in FIGS. 4C and 4D, $\theta 2a$ and $\theta 2b$ are different, and in the exemplary embodiment, $\theta 2a$ is formed larger than $\theta 2b$ ($\theta 2a > \theta 2b$).

Further, as shown in FIGS. 5A to 5D, the horizontal cross-sectional shape of the second lower semiconductor side surface 212 is different between the lower semiconductor top surface 213 side (FIGS. 5A and 5B) in the lower semiconductor layer 210 and the lower semiconductor bottom surface 214 side (FIGS. 5C and 5D) in the lower semiconductor layer 210.

Specifically, as shown in FIGS. 5A and 5B, on the lower semiconductor top surface 213 side in the lower semiconductor layer 210, the horizontal cross section of the second lower semiconductor side surface 212 has a structure in which regions on a straight line corresponding to the second flat portion 212b and regions corresponding to the second protruding portions 212a that protrude toward the outside of the lower semiconductor layer 210 from the regions on the straight line are alternately and periodically arranged.

On the other hand, as shown in FIGS. 5C and 5D, since the second protruding portions 212a are not formed on the lower semiconductor bottom surface 214 side in the lower semiconductor layer 210, the horizontal cross section of the second lower semiconductor side surface 212 has a shape of a straight line corresponding to the second flat portion 212b.

Further, as shown in FIG. 4D and in the above-described FIG. 2, at a border portion between the substrate top surface 113 of the sapphire substrate 100 and the second substrate side surface 112, the second cutout 122a is formed at a region corresponding to the second flat portion 212b positioned at a center of the adjacent second protruding portions 212a in the second lower semiconductor side surface 212. In the exemplary embodiment, as shown in FIGS. 2 and 5A to 5D, the two adjacent second protruding portions 212a and the second flat portion 212b positioned between the two adjacent second protruding portions 212a constitute adjacent three sides in a hexagon around the second cutout 122a as viewed from the direction vertical to the substrate top surface 113.

On the other hand, as shown in FIG. 4C and FIG. 2, at a border portion between the substrate top surface 113 of the sapphire substrate 100 and the second substrate side surface 112, no cutout is formed at a region corresponding to the second flat portion 212a of the second lower semiconductor side surface 212.

Moreover, as shown in FIGS. 5A to 5D, in the exemplary embodiment, in the lower semiconductor layer 210, the area of the cross section of the lower semiconductor layer 210 becomes gradually larger along with a move from the lower semiconductor bottom surface 214 side toward the lower semiconductor top surface 213 side.

(Structure of Light Emitting Device Having Semiconductor Light Emitting Element)

Subsequently, a structure of a light emitting device 5 equipped with the semiconductor light emitting element 1 of the exemplary embodiment will be described.

Figure 6:
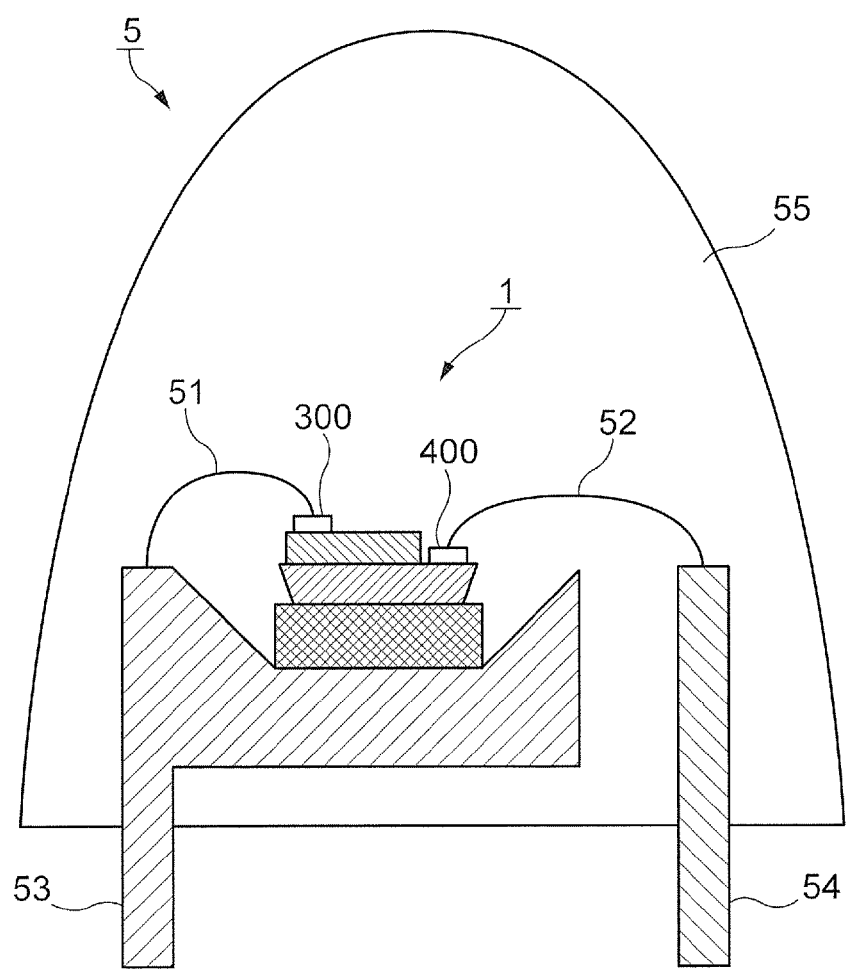
FIG. 6 is an example of a cross-sectional view of a light emitting device to which the semiconductor light emitting element according to the exemplary embodiment is applied.

FIG. 6 is an example of a cross-sectional view of the light emitting device 5 to which the semiconductor light emitting element 1 according to the above-described exemplary embodiment is applied. As shown in FIG. 6, the light emitting device 5 is of a shell-type, to which the semiconductor light emitting element 1 of the exemplary embodiment is mounted.

As shown in FIG. 6, in the semiconductor light emitting element 1 of the exemplary embodiment, the sapphire substrate 100 side in the semiconductor light emitting element 1 is die-bonded to a p-side frame 53, which is a base stage of the light emitting device 5. Moreover, the p-electrode 300 in the semiconductor light emitting element 1 is connected to the p-side frame 53 via a p-side bonding wire 51, and similarly, the n-electrode 400 is connected to an n-side frame 54 via an n-side bonding wire 52. In addition, the periphery of the semiconductor light emitting element 1 is sealed with a mold 55 made of a transparent resin or the like.

It should be noted that the light emitting device 5 is formed by combining, for example, the light emitting element 1 and a fluorescent material, and can be formed by a method known to those skilled in the art to have a configuration known to those skilled in the art. Further, there is known a technique that obtains white light by combining the semiconductor light emitting element 1 and a fluorescent material, and it is possible to also adopt such a technique into the light emitting device 5 without any limitation. Moreover, as the light emitting device 5 having the semiconductor light emitting element 1, other structures or shapes, such as a surface mount type and a side view type, can be used without any limitation.

Subsequently, description will be given to light emitting operation by the light emitting device 5 shown in FIG. 6.

By applying a current, which is directed to the n-side frame 54 from the p-side frame 53, to the semiconductor light emitting element 1 via the p-side bonding wire 51 and the n-side bonding wire 52 provided to the light emitting device 5, a current directed to the n-electrode 400 from the p-electrode 300 flows in the semiconductor light emitting element 1 via the p-type semiconductor layer 205 (refer to FIG. 3), the light emitting layer 204 (refer to FIG. 3) and the n-type semiconductor layer 203 (refer to FIG. 3). As a result, for example, blue light is outputted from the light emitting layer 204.

The light outputted from the light emitting layer 204 propagates in the laminated semiconductor layer 200 with the light emitting layer 204 at the center toward the sapphire substrate 100 side and the p-type semiconductor layer 205 side.

Here, the first lower semiconductor side surface 211 and the second lower semiconductor side surface 212 in the semiconductor light emitting element 1 of the exemplary embodiment have a structure inclined toward the outside with respect to the direction vertical to the substrate top surface 113 of the sapphire substrate 100. Consequently, the light having been outputted from the light emitting layer 204, having propagated in the lower semiconductor layer 210 and having reached the first lower semiconductor side surface 211 or the second lower semiconductor side surface 212 is extracted to the outside via the first lower semiconductor side surface 211 or the second lower semiconductor side surface 212, or reflected by the first lower semiconductor side surface 211 or the second lower semiconductor side surface 212 toward the upper semiconductor layer 220 side. This increases the amount of light extracted from the first lower semiconductor side surface 211 and the second lower semiconductor side surface 212 and the amount of light extracted from an upper side (the side on which the p-electrode 300 and the n-electrode 400) of the semiconductor light emitting element 1 compared to the case where the first lower semiconductor side surface 211 and the second lower semiconductor side surface 212 are not inclined with respect to the direction vertical to the substrate top surface 113.

Further, by the first lower semiconductor side surface 211 and the second lower semiconductor side surface 212 having the structure inclined toward the outside with respect to the direction vertical to the substrate top surface 113, each side surface of the lower semiconductor layer 210 (the first lower semiconductor side surface 211 and the second lower semiconductor side surface 212) are not parallel to each other. Consequently, since reflection angles, when the light propagated in the lower semiconductor layer 210 reflects, are different on each side surface, it is possible to suppress repeated reflections of the light outputted from the light emitting layer 204 in the laminated semiconductor layer 200. Accordingly, compared to the case with no present configuration, it becomes possible to improve the light extraction efficiency in the semiconductor light emitting element 1.

Moreover, in the exemplary embodiment, both of the first lower semiconductor side surface 211 and the second lower semiconductor side surface 212 in the lower semiconductor layer 210 have the projections and depressions. Accordingly, in comparison with the case where the first lower semiconductor side surface 211 or the second lower semiconductor side surface 212 has no projections and depressions, the surface area of the first lower semiconductor side surface 211 and the second lower semiconductor side surface 212 can be larger. Further, in comparison with the case where the present configuration is not provided, the inclined angle of the first lower semiconductor side surface 211 and the second lower semiconductor side surface 212 with respect to the direction vertical to the substrate top surface 113 is varied.

This makes it possible to, in comparison with the case where the first lower semiconductor side surface 211 or the second lower semiconductor side surface 212 has no projections and depressions, widen a plane capable of reflecting the light outputted from the light emitting layer 204 toward the upper semiconductor layer 220 side, to thereby improve the light extraction efficiency in the semiconductor light emitting element 1. Further, in comparison with the case where the present configuration is not provided, by varying the reflection angle to reflect the light that is outputted from the light emitting layer 204 and propagating within the lower semiconductor layer 210, the probability of occurrence of internal reflections of light in the laminated semiconductor layer 200 is reduced, and thereby it becomes possible to improve the light extraction efficiency in the semiconductor light emitting element 1.

Further, since both of the first lower semiconductor side surface 211 and the second lower semiconductor side surface 212 have the projections and depressions, it becomes also possible to diffuse the light that is outputted from the light emitting layer 204 and reaches the first lower semiconductor side surface 211 or the second lower semiconductor side surface 212 to the outside by the projections and depressions, to extract the light to the outside.

Accordingly, in comparison with the case where the first lower semiconductor side surface 211 or the second lower semiconductor side surface 212 has no projections and depressions, it becomes possible to extract more light outputted from the light emitting layer 204 to the outside, and to improve the light extraction efficiency in the semiconductor light emitting 1.

Still further, in the exemplary embodiment, the first lower semiconductor side surface 211 has a structure in which the first projecting portions 211a and the first depressing portions 211b are alternately arranged along the first direction x. In other words, the angle formed by the first lower semiconductor side surface 211 and the substrate top surface 113 in the sapphire substrate 100 is periodically varied along the first direction x.

On the other hand, in the exemplary embodiment, the second lower semiconductor side surface 212 has the second flat portions 212b that are substantially flat and the plural second protruding portions 212a formed on the second flat portions 212b. In other words, the angle formed by the second lower semiconductor side surface 212 and the substrate top surface 113 in the sapphire substrate 100 is different between the second protruding portions 212a and the second flat portions 212b, and is periodically varied along the second direction y.

Consequently, in comparison with the case where the angle formed by the first lower semiconductor side surface 211 and the substrate top surface 113 is not varied along the first direction x, the first lower semiconductor side surface 211 in the exemplary embodiment is capable of reflecting the light of incident angle in wider range, of the light incident on the first lower semiconductor side surface 211.

Similarly, in comparison with the case where the angle formed by the second lower semiconductor side surface 212 and the substrate top surface 113 is not varied along the second direction y, it is possible to reflect the light of incident angle in wider range, of the light incident on the second lower semiconductor side surface 212.

Accordingly, in comparison with the case where the present configuration is not provided, it becomes possible to reflect more light by the first lower semiconductor side surface 211 and the second lower semiconductor side surface 212, to thereby make it possible to improve the light extraction efficiency in the semiconductor light emitting element 1.

Moreover, in the exemplary embodiment, the shape of projections and depressions in the first lower semiconductor side surface 211 is different from the shape of projections and depressions in the second lower semiconductor side surface 212.

Consequently, it becomes possible to reflect the light of different incident angles incident on the first lower semiconductor side surface 211 or the second lower semiconductor side surface 212 by the shape of projections and depressions in the first lower semiconductor side surface 211 and the shape of projections and depressions in the second lower semiconductor side surface 212.

Accordingly, in comparison with the case where the shape of projections and depressions in the first lower semiconductor side surface 211 and the shape of projections and depressions in the second lower semiconductor side surface 212 are the same, it becomes possible to reflect the light of incident angle in wider range, and thereby it becomes possible to improve the light extraction efficiency in the semiconductor light emitting element 1.

Moreover, in the exemplary embodiment, in the first lower semiconductor side surface 211 and the second lower semiconductor side surface 212, the projections and depressions become larger along with a move from the lower semiconductor bottom surface 214 toward the lower semiconductor top surface 213 along the third direction z. Accordingly, the light outputted from the light emitting layer 204 and incident on the vicinity of the lower semiconductor top surface 213 in the lower semiconductor layer 210 can be reflected more efficiently toward the upper semiconductor layer 220 by the larger projections and depressions on the lower semiconductor top surface 213 side in the first lower semiconductor side surface 211 and the second lower semiconductor side surface 212.

Accordingly, in comparison with the case where the present configuration is not provided, it becomes possible to improve the light extraction efficiency in the semiconductor light emitting element 1.

Moreover, in the sapphire substrate 100 in the semiconductor light emitting element 1 of the exemplary embodiment, at each of the border portion between the substrate top surface 113 and the first substrate side surface 111 and the border portion between the substrate top surface 113 and the second substrate side surface 112, the plural first cutouts 121a and the plural second cutouts 122a are formed, respectively. Consequently, in the case where the light outputted from the light emitting layer 204 transmits through the laminated semiconductor layer 200 to be incident on the sapphire substrate 100, it becomes possible to diffuse the light by the first cutouts 121a or the second cutouts 122a.

Accordingly, in comparison with the case where the present configuration is not provided, it becomes possible to improve the light extraction efficiency in the semiconductor light emitting element 1.

(Method for Producing Semiconductor Light Emitting Element)

Figure 7:
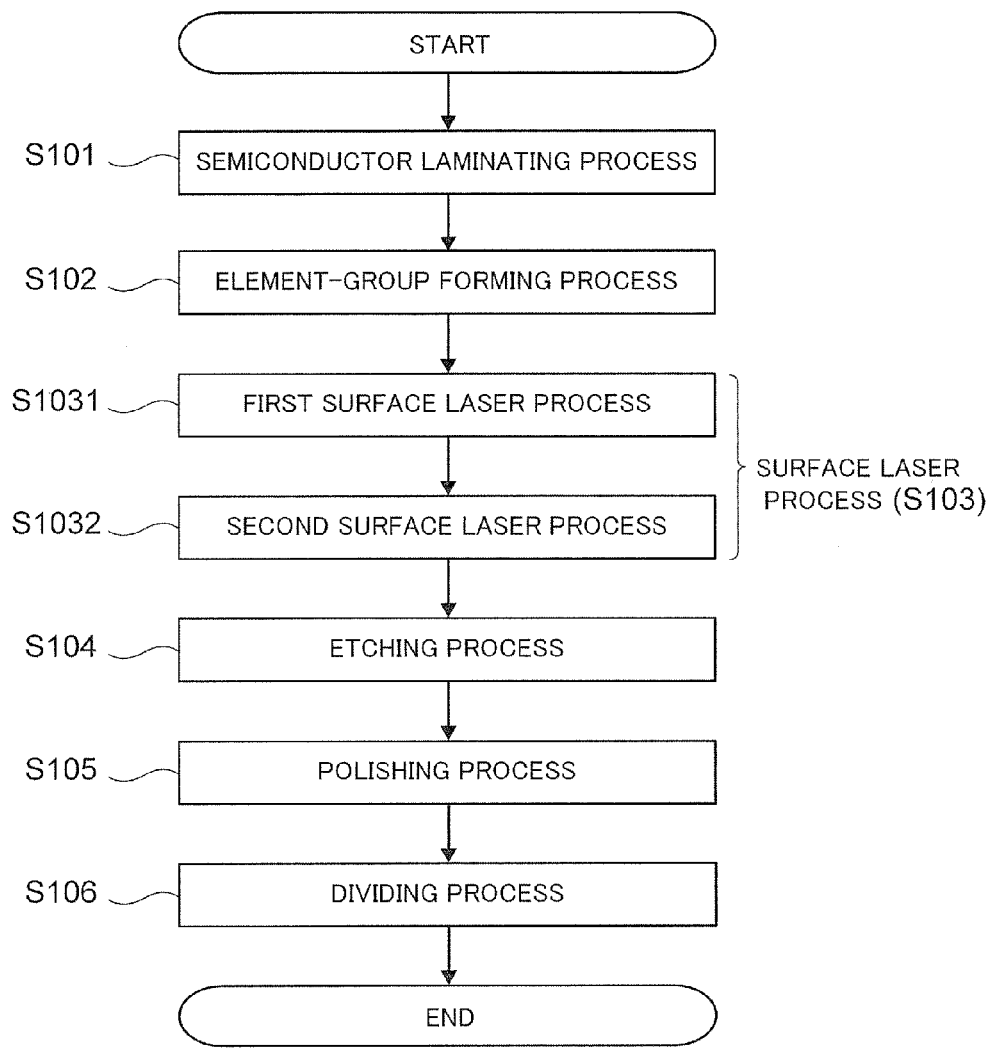
FIG. 7 is a flowchart showing an example of a method for producing the semiconductor light emitting element.

Subsequently, description will be given to an example of a method for producing the semiconductor light emitting element 1 of the exemplary embodiment shown in FIGS. 1 and 2. FIG. 7 is a flowchart showing an example of a method for producing the semiconductor light emitting element 1.

In this specific example, first, a semiconductor laminating process for forming the laminated semiconductor layer 200 on the wafer-shaped sapphire substrate 100 is performed (step 101).

Next, an element-group forming process for obtaining an element-group formation substrate 10 (refer to FIG. 9 to be described later) by forming plural first groove portions 11 (refer to FIG. 9 to be described later), plural second groove portions 12 (refer to FIG. 9 to be described later), the plural p-electrodes 300 (refer to FIG. 1) and the plural n-electrodes 400 on the laminated semiconductor layer 200 formed on the sapphire substrate 100 in step 101 is performed (step 102).

Subsequently, a surface laser process for forming first irradiation lines 21 (refer to FIG. 10 to be described later) and second irradiation lines 22 (refer to FIG. 10 to be described later) by irradiating the element-group formation substrate 10 with laser along the first groove portions 11 and the second groove portions 12 from the front surface side of the element-group formation substrate 10 on which the p-electrodes 300 and the n-electrodes 400 is performed (step 103).

Further, subsequently, an etching process for applying wet etching to the element-group formation substrate 10, which has been irradiated with surface laser in step 103, is performed (step 104).

Next, a polishing process for grinding and polishing the substrate bottom surface 114 of the sapphire substrate 100 in the element-group formation substrate 10 that has been subjected to the wet etching in step 104 is performed (step 105).

Then, a dividing process for obtaining the semiconductor light emitting element 1 formed into individual pieces (refer to FIG. 1) from the element-group formation substrate 10 by dividing the element-group formation substrate 10, which has been ground and polished in step 105, along the first irradiation lines 21 and the second irradiation lines 22 is performed (step 106).

Subsequently, the process in each of the above-described steps will be described in order.

First, the semiconductor laminating process in step 101 will be described.

In the semiconductor laminating process in step 101, first, the wafer-shaped sapphire substrate 100 composed of a sapphire single crystal, in which C-plane is a principal plane, is prepared, and a surface treatment is applied. As the surface treatment, plural projecting portions 113a (refer to FIG. 3) are formed on the substrate top surface 113 in the wafer-shaped sapphire substrate 100 by use of, for example, wet etching, dry etching, the sputtering method or the like.

Next, the intermediate layer 201 composed of MN is formed on the wafer-shaped sapphire substrate 100, which has been subjected to the surface treatment, by the sputtering method or the like. It should be noted that the intermediate layer 201 is formed not only by the sputtering method, but also by an MOCVD method.

Subsequently, on the wafer-shaped sapphire substrate 100 on which the intermediate layer 201 has been formed, the base layer 202, the n-type semiconductor layer 203 (the n-contact layer 203a and the n-cladding layer 203b), the light emitting layer 204 and the p-type semiconductor layer 205 (the p-cladding layer 205a and the p-contact layer 205b), which are composed of the group III nitride, are sequentially laminated. As a method for laminating these layers, the MOCVD method (metal-organic chemical vapor deposition method), an HVPE method (hydride vapor phase epitaxy method), an MBE method (molecular beam epitaxy method), the sputtering method or the like can be used. As an especially preferred lamination method, the MOCVD method is provided in terms of layer thickness controlling properties and volume productivity.

In the MOCVD method, for example, in the case of forming a layer composed of the group III nitride semiconductor, hydrogen ($H_2$) or nitrogen ($N_2$) is used as a carrier gas, trimethylgallium (TMG) or triethylgallium (TEG) is used as a source of Ga which is a group III raw material, trimethylaluminum (TMA) or triethylaluminum (TEA) is used as a source of Al, trimethylindium (TMI) or triethylindium (TEI) is used as a source of In, ammonia ($NH_3$), hydrazine ($N_2H_4$) or the like is used as a source of N which is a group V raw material. Further, as a dopant, for the n-type, monosilane ($SiH_4$) or disilane ($Si_2H_6$) is used as a raw material of Si, and organic germanium compounds are used as a Ge raw material, and for the p-type, for example, Bis(cyclopentadienyl)magnesium ($Cp_2Mg$) or Bis(ethylcyclopentadienyl)magnesium (($EtCp)_2Mg$) is used as an Mg raw material.

Figure 8:
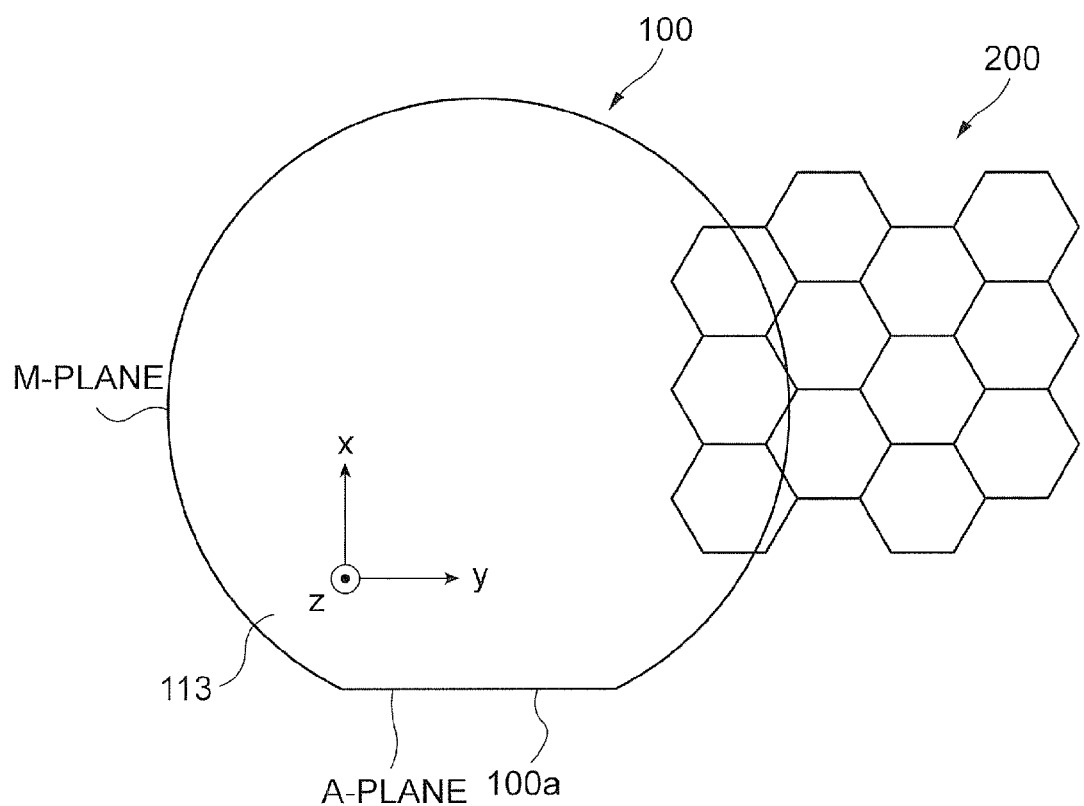
FIG. 8 is a schematic view indicating a relation between a crystal orientation of the sapphire substrate and a crystal orientation of the laminated semiconductor layer formed on the sapphire substrate.

FIG. 8 is a schematic view indicating a relation between a crystal orientation of the sapphire substrate 100 and a crystal orientation of the laminated semiconductor layer 200 formed on the sapphire substrate 100 in the exemplary embodiment.

In the exemplary embodiment, as the wafer-shaped sapphire substrate 100, a sapphire single crystal whose substrate top surface 113 is C-plane can be used. Further, as shown in FIG. 8, at a limb portion of the wafer-shaped sapphire substrate 100, an orientation flat (OF: Orientation Flat) 100a that indicates crystal orientation of the sapphire substrate 100 is provided. In the exemplary embodiment, the OF 100a is formed on the A-plane of the sapphire single crystal.

It should be noted that, in the exemplary embodiment, the direction along the M-plane of the sapphire single crystal constituting the wafer-shaped sapphire substrate 100 is the first direction x, and the direction along the A-plane of the sapphire single crystal is the second direction y.

The group III nitride constituting the laminated semiconductor layer 200 has a crystal structure of a hexagonal system. Then, the group III nitride constituting the laminated semiconductor layer forms a crystal lattice in a shape of a hexagonal column on the C-plane of the sapphire single crystal constituting the sapphire substrate 100 (substrate top surface 113), in which a plane along the substrate top surface 113 is assumed to be a bottom surface and the third direction z (that is, the c-axis direction of the sapphire single crystal constituting the sapphire substrate 100) is assumed to be an axis.

Then, as shown in FIG. 8, the crystal lattices of the group III nitride constituting the laminated semiconductor layer 200 are oriented so that, of six sides of the hexagon, two sides facing each other are along the second direction y. In this case, as shown in FIG. 8, vertexes of the hexagon of each crystal lattice become arranged at periodically regular intervals along the first direction x.

In other words, in the exemplary embodiment, the shape of the crystal lattice of the laminated semiconductor layer 200 formed on the wafer-shaped sapphire substrate 100 is different between the first direction x and the second direction y.

Here, in the exemplary embodiment, the plural projecting portions 113a (refer to FIG. 3) are formed on the substrate top surface 113 of the sapphire substrate 100. When the intermediate layer 201 composed of AlN (refer to FIG. 3), the base layer 202 and the n-contact layer 203a composed of the group III nitride semiconductor layer, such as GaN, and the like are laminated on such a substrate top surface 113 of the sapphire substrate 100, first, plural island-shaped crystals extending toward the direction vertical to the substrate top surface 113 are formed. Then, by continuing further lamination, the group III nitride grows toward the direction vertical to the substrate top surface 113, and the plural island-shaped crystals are tied to one another, and thereby a flat crystal growth surface is obtained in due time.

Accordingly, each of the intermediate layer 201, the base layer 202, the n-contact layer 203a and the like is formed from the lower semiconductor bottom surface 214 side toward the lower semiconductor top surface 213 side so that crystallinity of the group III nitride is gradually improved.

Consequently, the lower semiconductor layer 210 as a whole is also formed from the lower semiconductor bottom surface 214 side toward the lower semiconductor top surface 213 side so that crystallinity of the group III nitride is gradually improved.

Further, in the exemplary embodiment, in the case where the laminated semiconductor layer 200 is laminated on the sapphire substrate 100 by the MOCVD method, the crystal of the group III nitride constituting the laminated semiconductor 200 grows so that a (000-1) plane, which is an N-polarity plane, faces the substrate top surface 113 side of the sapphire substrate 100, and a (0001) plane, which is a polarity plane of the group III element (for example, a Ga-polarity plane) faces the upper semiconductor top surface 223 side of the upper semiconductor layer 220.

Subsequently, the element-group forming process in step 102 will be described.

Figure 9A:
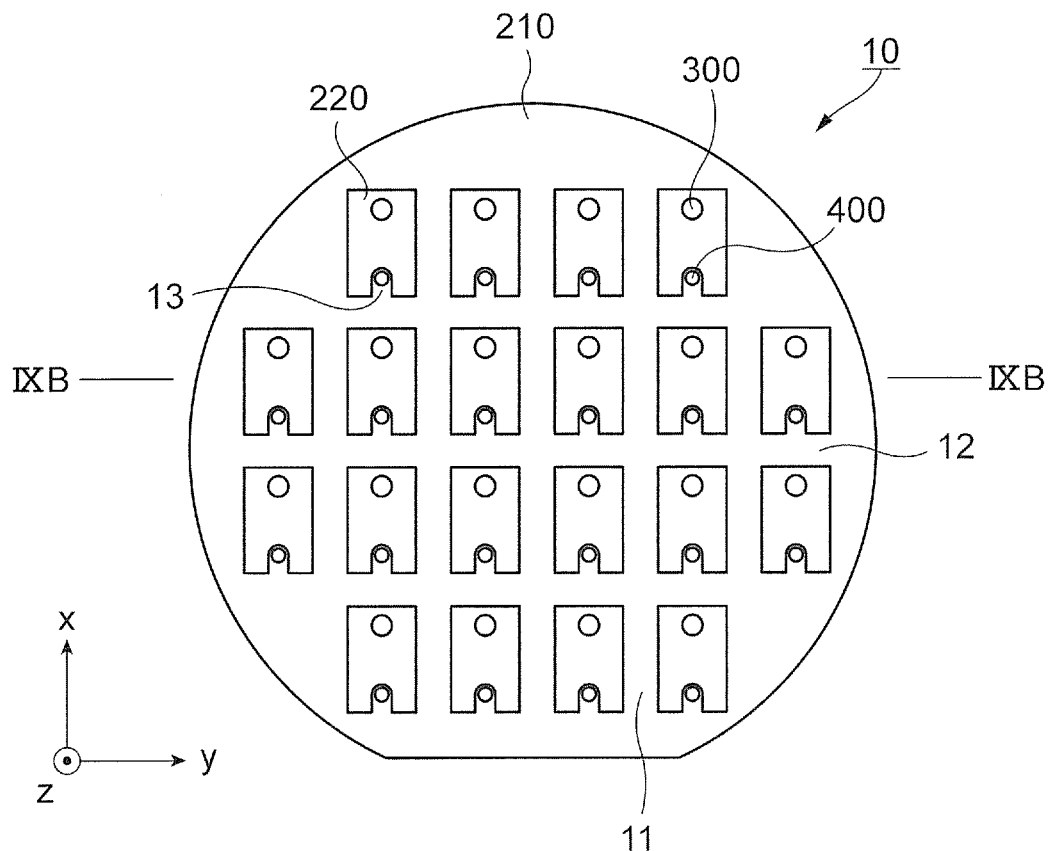
FIGS. 9A and 9B are diagrams showing an example of a configuration of an element-group formation substrate obtained by performing an element-group forming process.
Figure 9B:
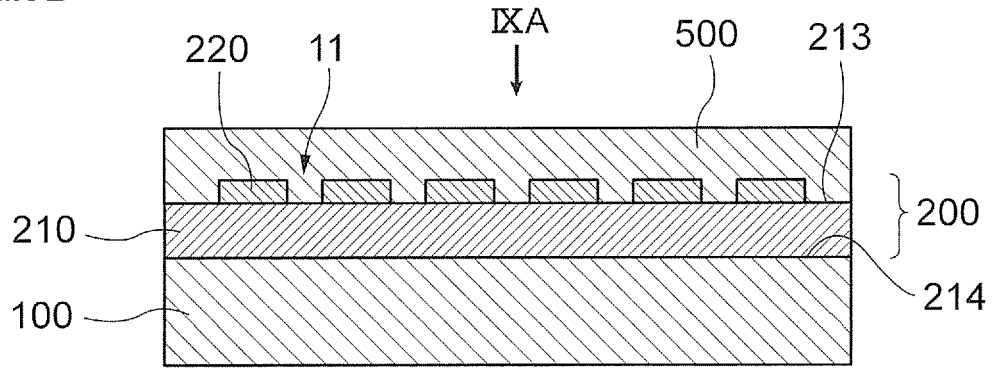

FIGS. 9A and 9B are diagrams showing an example of a configuration of the element-group formation substrate 10 obtained by applying the element-group forming process in step 102 to the wafer-shaped sapphire substrate 100 on which the laminated semiconductor layer 200 is formed. Here, FIG. 9A is a top view of the element-group formation substrate 10 as viewed from the front surface of the element-group formation substrate 10 on which the p-electrodes 300 and the n-electrodes 400 are formed, and FIG. 9B is a IXB-IXB cross-sectional view of FIG. 9A.

In the element-group forming process in step 102, first, part of the n-contact layer 203a (refer to FIG. 3) is exposed by removing a part of the laminated semiconductor layer 200 from the wafer-shaped sapphire substrate 100 on which the laminated semiconductor layer 200 has been laminated in the semiconductor laminating process in step 101. Consequently, the first groove portions 11, the second groove portions 12 and an n-electrode mount portion 13 for mounting the n-electrodes 400 is formed.

As shown in FIG. 9A, the plural first groove portions 11 are formed, and each of them is provided along the first direction x. The plural first groove portions 11 are arranged in substantially parallel to each other so that spaces between the adjacent first groove portions 11 are equal. Similarly, the plural second groove portions 12 are formed, and each of them is provided along the second direction y. The plural second groove portions 12 are arranged in substantially parallel to each other so that spaces between the adjacent second groove portions 12 are equal.

In the exemplary embodiment, the spaces between the adjacent first groove portions 11 are formed smaller than the spaces between the adjacent second groove portions 12.

The plural n-electrode mount portions 13 are formed. In this specific example, the plural n-electrode mount portions 13 are arranged along the second direction y. Then, each of the plural n-electrode mount portions 13 is provided in connection with the second groove portion 12.

As shown in FIGS. 9A and 9B, by forming the first groove portions 11 and the second groove portions 12, in the laminated semiconductor layer 200, the lower semiconductor layer 210 provided on all over the substrate top surface 113, and upper semiconductor layer 220, which is provided on the lower semiconductor top surface 213 and is divided into plural regions by the first groove portions 11 and the second groove portions 12, are formed.

As shown in FIG. 9A, the shape of the upper semiconductor layer 220 as viewed from the direction vertical to the substrate top surface 113 is a rectangle in which the direction along the first direction x is regarded as a long side and the direction along the second direction y is regarded as a short side.

As a method for removing a part of the laminated semiconductor layer 200 for forming the first groove portions 11, the second groove portions 12 and the n-electrode mount portion 13, a known photolithographic technology or a known etching technology can be used. In particular, as means of forming the first groove portions 11, the second groove portions 12 and the n-electrode mount portion 13, it is preferable to use the etching method such as the wet etching, dry etching and the like. This is because, compared to other methods, the etching method is less likely to cause damage to the part of the laminated semiconductor layer 200 that is not removed.

As the etching method, in the case of the dry etching, for example, the method such as reactive ion etching, ion milling, focused beam etching or ECR etching can be used, and in the case of the wet etching, for example, mixed acid of sulfuric acid and phosphoric acid can be used. However, prior to performing etching, a predetermined mask is formed on the surface of the laminated semiconductor layer 200 so as to obtain a desired chip shape.

It should be noted that, as a method of forming the first groove portions 11 and the second groove portions 12, other than the etching method, any known method such as a dicing method and a method employing laser irradiation can be used without any limitation.

Moreover, in the exemplary embodiment, the n-electrode mount portions 13 are formed at the same time with the formation of the first groove portions 11 and the second groove portions 12; however, these may be formed in separate processes.

In the element-group forming process in step 102, subsequently, the p-electrode 300 is formed at a predetermined position on each of the upper semiconductor layers 220, and the n-electrode 400 is formed on each of the n-electrode mount portions 13.

As the p-electrode 300 and the n-electrode 400, various types of compositions and structures are known, and these known compositions and structures can be used without any limitation.

It should be noted that, between the p-electrode 300 and the p-contact layer 205b in the laminated semiconductor layer 200, it is desirable to form a transparent conductive film (illustration is omitted) composed of ITO, IZO and so on having conductivity and optical transparency to the light emitted from the light emitting layer 204. By providing such a transparent conductive film, it becomes possible to reduce the operation voltage and to diffuse the current in the semiconductor light emitting element 1, to thereby cause the entire light emitting layer 204 to emit light.

Moreover, as the methods for forming the p-electrode 300 and the n-electrode 400, known methods such as a vacuum deposition method and the sputtering method can be employed without any limitation.

In the element-group forming process in step 102, a protecting film 500 composed of $SiO_2$ or the like is formed to cover the top surface of the laminated semiconductor layer 200, the p-electrodes 300 and the n-electrodes 400. It should be noted that, in FIG. 9A, illustration of the protecting film 500 is omitted.

Through the above processes, the element-group formation substrate 10, in which the lower semiconductor layer 210, the upper semiconductor layer 220 divided into plural regions, the plural p-electrodes 300 and the plural n-electrodes 400 are formed on the sapphire substrate 100, is obtained.

Subsequently, the surface laser process in step 103 will be described.

Figure 10A:
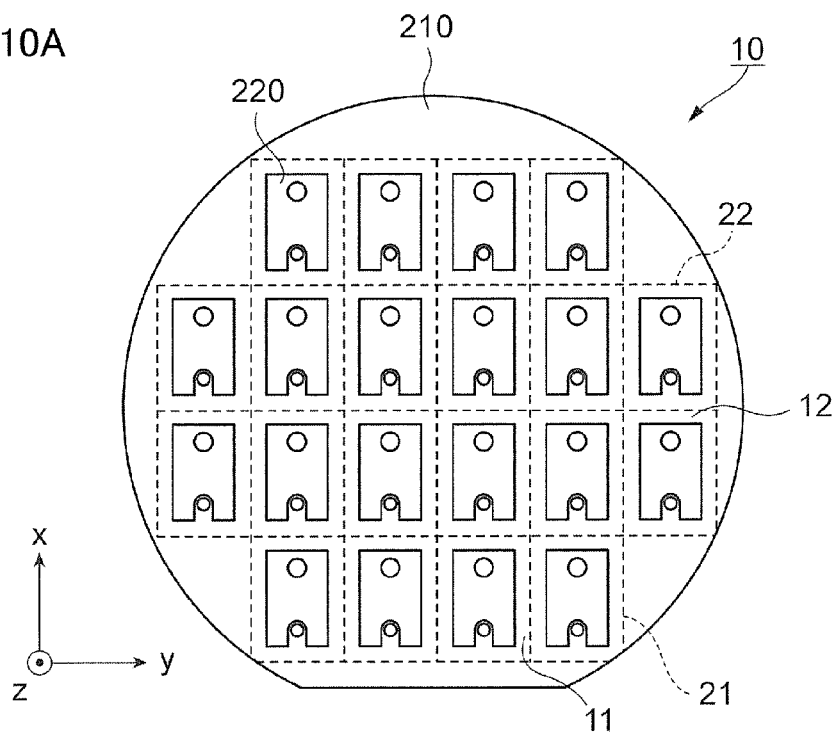
FIGS. 10A and 10B are top views showing an example of a configuration of the element-group formation substrate after forming first irradiation lines and second irradiation lines obtained by performing a surface laser process.
Figure 10B:
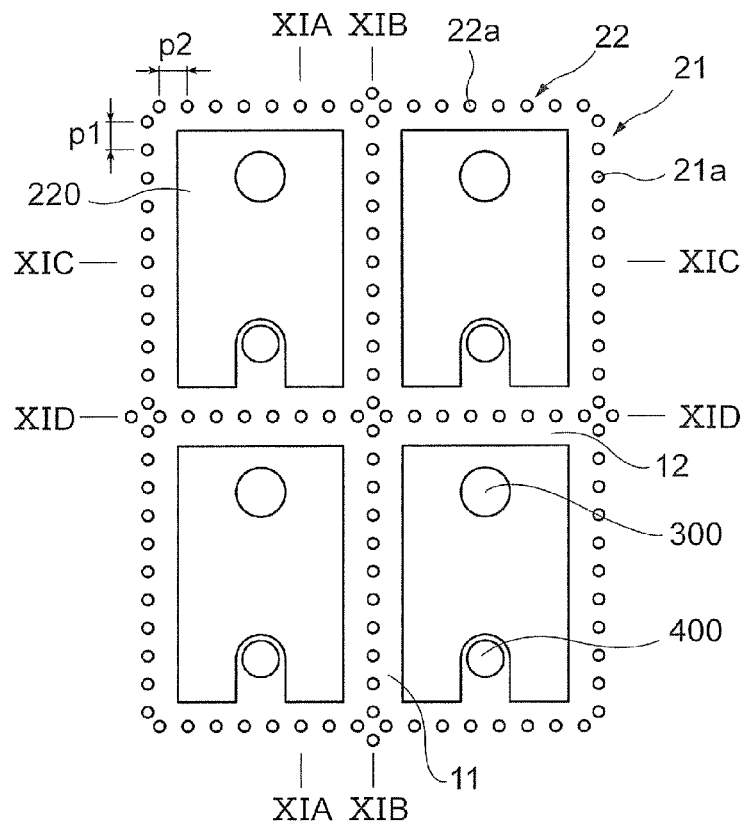

FIGS. 10A and 10B are top views showing an example of a configuration of the element-group formation substrate 10 after forming the first irradiation lines 21 and the second irradiation lines 22 obtained by applying the surface laser process in step 103 to the element-group formation substrate 10. Here, FIG. 10A is a top view of the element-group formation substrate 10 after forming the first irradiation lines 21 and the second irradiation lines 22 as viewed from the side facing the plane on which the p-electrodes 300 and the n-electrodes 400 are formed, and FIG. 10B is an enlarged top view that enlarges a part of FIG. 10A. It should be noted that, in FIGS. 10A and 10B, illustration of the protecting film 500 is omitted.

Figure 11A:
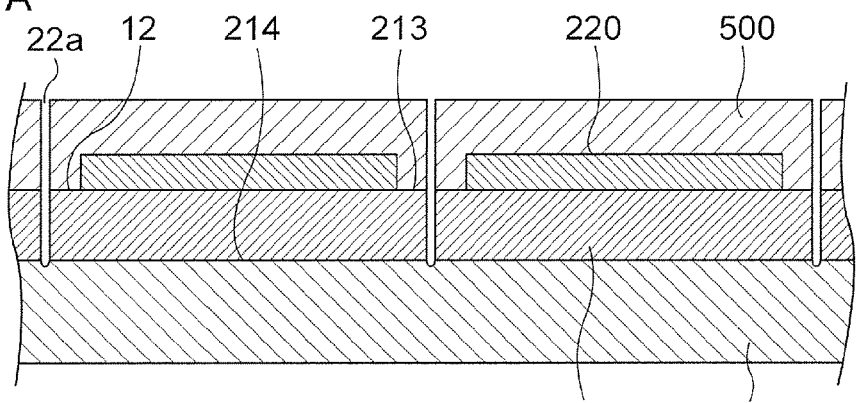
FIGS. 11A to 11D are vertical cross-sectional views showing an example of a configuration of the element-group formation substrate after forming first irradiation lines and second irradiation lines obtained by performing a surface laser process.
Figure 11B:
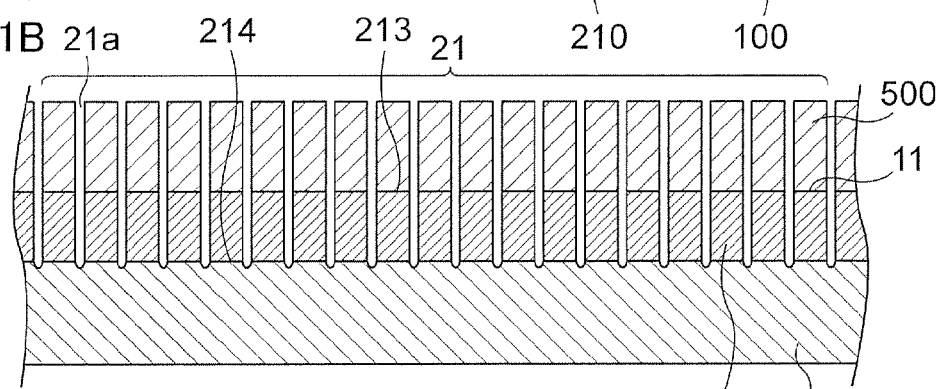
Figure 11C:
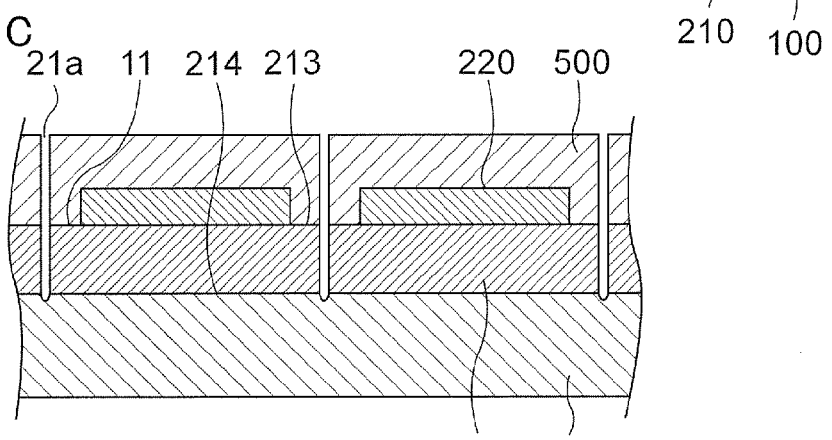
Figure 11D:
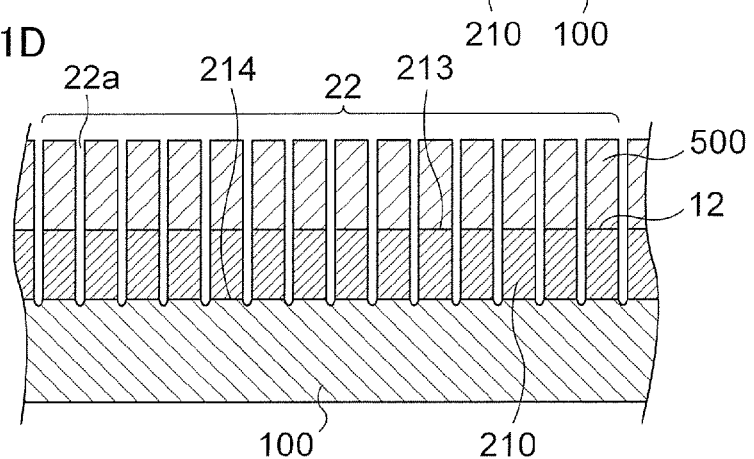

Moreover, FIGS. 11A to 11D are vertical cross-sectional views showing an example of the configuration of the element-group formation substrate 10 after forming the first irradiation lines 21 and the second irradiation lines 22 obtained by applying the surface laser process in step 103 to the element-group formation substrate 10. FIG. 11A is a XIA-XIA cross-sectional view in FIG. 10B, FIG. 11B is a XIB-XIB cross-sectional view in FIG. 10B, FIG. 11C is a XIC-XIC cross-sectional view in FIG. 10B and FIG. 11D is a XID-XID cross-sectional view in FIG. 10B.

The surface laser process in step 103 is configured with a first surface laser process in step 1031 and a second surface laser process in step 1032. First, the first surface laser process in step 1031 will be described.

In the first surface laser process in step 1031, the first irradiation lines 21 are formed by laser irradiation, which is performed from the side where the protecting film 500 is formed, along the first groove portions 11 formed in the element-group forming process in step 102.

As shown in FIG. 10A and FIG. 11B, the plural first irradiation lines 21 are formed along the respective plural first groove portions 11. The plural first irradiation lines 21 are arranged in substantially parallel to each other so that spaces between the adjacent first irradiation lines 21 are equal.

Further, as shown in FIG. 10A and FIG. 11B, each of the plural first irradiation lines 21 is configured with plural first opening portions 21a formed by laser irradiation to be arranged along the first direction x and the first groove portion 11. The plural first opening portions 21a are arranged so that the distance between the adjacent first opening portions 21a becomes the first pitch p1.

Further, as shown in FIGS. 11B and 11C, which are the vertical cross-sectional views, each of the plural first opening portions 21a penetrates the protecting film 500 and the lower semiconductor layer 210 in the laminated semiconductor layer 200 and reaches the sapphire substrate 100. Then, on the substrate top surface 113 of the sapphire substrate 100 in each of the plural first opening portions 21a, a laser mark is formed. It should be noted that, in the exemplary embodiment, the shape of each of the plural first opening portions 21a is a cylinder.

The first irradiation lines 21 are formed by a method using laser irradiation.

To be described specifically, the element-group formation substrate 10 is irradiated with pulse-oscillated laser light along the first groove portion 11 from the side where the protecting film 500 is formed. At this time, irradiation of the laser light is performed so that the laser light transmits the protecting film 500 and the lower semiconductor layer 210 in the laminated semiconductor layer 200 to reach the inside of the sapphire substrate 100.

In the exemplary embodiment, the position of irradiation of the laser light is set to be sequentially moved along the first groove portion 11 every time the laser light for a single pulse is emitted so that the pitch between the adjacent laser irradiation positions becomes the first pitch p1. Accordingly, in the protecting film 500 and the lower semiconductor layer 210, the plural first opening portions 21a, which penetrate from the top surface side of the protecting film 500 exposed to the outside toward the sapphire substrate 100 side and reach the sapphire substrate 100, are sequentially formed along the first groove portion 11. The first irradiation line 21 is configured with the plural first opening portions 21a formed along the first groove portion 11.

As the laser that can be used to form the first irradiation lines 21, for example, a $CO_2$ laser, a YAG laser and an excimer laser or the like of a pulse-irradiation type can be provided. Moreover, as the wavelength of the laser, for example, 1064 nm, 532 nm, 355 nm, 266 nm or the like can be used.

The pitch (first pitch p1) between the irradiation positions of the laser to be used for forming the first irradiation lines 21, the spot diameter of the laser and the like can be appropriately selected within the range in which the adjacent first opening portions 21a are not united together, that is, the range in which the pitch (first pitch p1) between the irradiation positions of the laser is larger than the spot diameter of the laser. The spot diameter of the laser preferably has a size of the order of 25% to 90% of the pitch (first pitch p1) between the irradiation positions of the laser. In the case where the spot diameter is less than 25% of the first pitch p1, since a space between the spots becomes large with respect to the spot diameter of the laser, there is a possibility that the projections and depressions on the first lower semiconductor side surface 211 formed in the etching process in step 104 to be described later become smaller. Moreover, in the case where the spot diameter is more than 90% of the first pitch p1, an overlap between the adjacent spots becomes larger, and as a result, there is a possibility that the projections and depressions on the first lower semiconductor side surface 211 become smaller.

Further, the frequency of the laser to be used for forming the first irradiation lines 21, the moving speed of the laser and the like can be appropriately selected.

In the exemplary embodiment, for example, the pitch (first pitch p1) between the irradiation positions of the laser is 10 µm, and the spot width of the laser is 7 µm to 9 µm. Moreover, the frequency of the laser is 50 kHz, and the moving speed of the laser is 500 nm/sec.

It should be noted that the spot diameter of the laser to be used for forming the first irradiation lines 21 is preferably smaller than the width of the first groove portion 11. If the spot diameter of the laser is larger than the width of the first groove portion 11, there is a possibility that the laser light reaches the upper semiconductor layer 220 including the light emitting layer 204, to thereby reduce the light extraction efficiency from the semiconductor light emitting element 1.

Moreover, the pitch (first pitch p1) between the irradiation positions of the laser to be used for forming the first irradiation lines 21 is preferably larger than the pitch between the plural projecting portions 113a formed on the substrate top surface 113 of the sapphire substrate 100 in the semiconductor laminating process in step 101.

The intensity of the laser to be used for forming the first irradiation lines 21 can be appropriately selected within the range to leave the laser mark on the sapphire substrate 100. In the exemplary embodiment, the intensity of the laser to be used for forming the first irradiation lines 21 is, for example, 2.0 W.

Subsequently, the second surface laser process in step 1032 will be described.

In the second surface laser process in step 1032, the second irradiation lines 22 are formed by laser irradiation, which is performed from the side where the protecting film 500 is formed, along the second groove portions 12 formed in the element-group forming process in step 102 on the element-group formation substrate 10 after finishing the first surface laser process in step 1031.

As shown in FIG. 10A and FIG. 11D, the plural second irradiation lines 22 are formed along the respective plural second groove portions 12. The plural second irradiation lines 22 are arranged in substantially parallel to each other so that spaces between the adjacent second irradiation lines 22 are equal. It should be noted that, in the exemplary embodiment, the pitch between the adjacent second irradiation lines 22 is larger than the pitch between the adjacent first irradiation lines 21.

Further, as shown in FIG. 10A and FIG. 11D, each of the plural second irradiation lines 22 is configured with plural second opening portions 22a formed by laser irradiation to be arranged along the second direction y and the second groove portion 12. The plural second opening portions 22a are arranged so that the distance between the adjacent second opening portions 22a becomes the second pitch p2.

Further, as shown in FIGS. 11A and 11D, which are the vertical cross-sectional views, each of the plural second opening portions 22a penetrates the protecting film 500 and the lower semiconductor layer 210 in the laminated semiconductor layer 200 and reaches the sapphire substrate 100. Then, on the substrate top surface 113 of the sapphire substrate 100 in each of the plural second opening portions 22a, a laser mark is formed. It should be noted that, in the exemplary embodiment, the shape of each of the plural second opening portions 22a is a cylinder.

As the laser that can be used to form the second irradiation lines 22, for example, a $CO_2$ laser, a YAG laser and an excimer laser or the like of a pulse-irradiation type can be provided. Moreover, as the wavelength of the laser, for example, 1064 nm, 532 nm, 355 nm, 266 nm or the like can be used. It should be noted that, as the laser to be used to form the second irradiation lines 22, the same or different laser as the one used to form the first irradiation lines 21 may be used.

The pitch (second pitch p2) between the irradiation positions of the laser to be used for forming the second irradiation lines 22, the spot diameter of the laser and the like can be appropriately selected within the range in which the adjacent second opening portions 22a are not united together, that is, the range in which the pitch (second pitch p2) between the irradiation positions of the laser is larger than the spot diameter of the laser. The spot diameter of the laser preferably has a size of the order of 25% to 90% of the pitch (second pitch p2) between the irradiation positions of the laser. In the case where the spot diameter is less than 25% of the second pitch p2, since a space between the spots becomes large with respect to the spot diameter of the laser, there is a possibility that the projections and depressions on the second lower semiconductor side surface 212 formed in the etching process in step 104 to be described later become smaller. Moreover, in the case where the spot diameter is more than 90% of the second pitch p2, an overlap between the adjacent spots becomes larger, and as a result, there is a possibility that the projections and depressions on the second lower semiconductor side surface 212 become smaller.

Further, the frequency of the laser to be used for forming the second irradiation lines 22, the moving speed of the laser and the like can be appropriately selected.

In the exemplary embodiment, for example, the pitch (second pitch p2) between the irradiation positions of the laser is 10 μm, and the spot width of the laser is 7 μm to 9 μm. Moreover, the frequency of the laser is 50 kHz, and the moving speed of the laser is 500 nm/sec.

It should be noted that the spot diameter of the laser to be used for forming the second irradiation lines 22 is preferably smaller than the width of the second groove portion 12. If the spot diameter of the laser is larger than the width of the second groove portion 12, there is a possibility that the laser light reaches the upper semiconductor layer 220 including the light emitting layer 204, to thereby reduce the light extraction efficiency from the semiconductor light emitting element 1.

Moreover, the pitch (second pitch p2) between the irradiation positions of the laser to be used for forming the second irradiation lines 22 is preferably larger than the pitch between the plural projecting portions 113a formed on the substrate top surface 113 of the sapphire substrate 100 in the semiconductor laminating process in step 101.

The intensity of the laser to be used for forming the second irradiation lines 22 can be appropriately selected within the range to leave the laser mark on the sapphire substrate 100. In the exemplary embodiment, the intensity of the laser to be used for forming the second irradiation lines 22 is, for example, 2.0 W.

It should be noted that, in the exemplary embodiment, to form the first irradiation line 21 constituted by the plural first opening portions 21a and the second irradiation line 22 constituted by the plural second opening portions 22a, laser irradiation is performed not to overlap the adjacent irradiation positions of the laser. Consequently, in the case where the frequency of the laser is constant, compared to the case where irradiation is performed to overlap the adjacent irradiation positions of the laser, it becomes possible to make the moving speed of the laser faster. Accordingly, in the exemplary embodiment, it becomes possible to improve productivity of the products compared to the case where laser irradiation is performed to overlap the adjacent irradiation positions of the laser.

It should be noted that, in the exemplary embodiment, laser irradiation is performed from above the protecting film 500 formed in the element-group forming process in step 102, and thereby the plural first opening portions 21a and the plural second opening portions 22a are formed. Accordingly, even in the case where broken pieces of the laminated semiconductor layer 200 or the protecting film 500 are scattered as the laser irradiation is performed, since these are adhered to the protecting film 500, it becomes possible to suppress adhesion of the broken pieces of the laminated semiconductor layer 200 or the like to the surface of the laminated semiconductor layer 200. Consequently, it becomes possible to suppress reduction of electrical properties or the like of the semiconductor light emitting element 1 due to the soil adhered to the surface of the laminated semiconductor layer 200.

Next, the etching process in step 104 will be described.

In the etching process in step 104, the first lower semiconductor side surface 211 (refer to FIG. 1) and the second lower semiconductor side surface 212 (refer to FIG. 1) in the lower semiconductor layer 210 are formed by applying wet etching to the element-group formation substrate 10 on which the plural first irradiation lines 21 and the plural second irradiation lines 22 are formed (refer to FIG. 10) by the surface laser process in step 103.

The wet etching is performed by immersing the element-group formation substrate 10, on which the plural first irradiation lines 21 and the plural second irradiation lines 22 are formed, just as the protecting film 500 is formed, in an etching solution such as orthophosphoric acid having been heated to a predetermined temperature.

Subsequently, description will be given to changes in the shapes of the first opening portion 21*a*, the second opening portion 22*a*, the first irradiation line 21 and the second irradiation line 22 in the etching process in step 104.

Figure 12A:
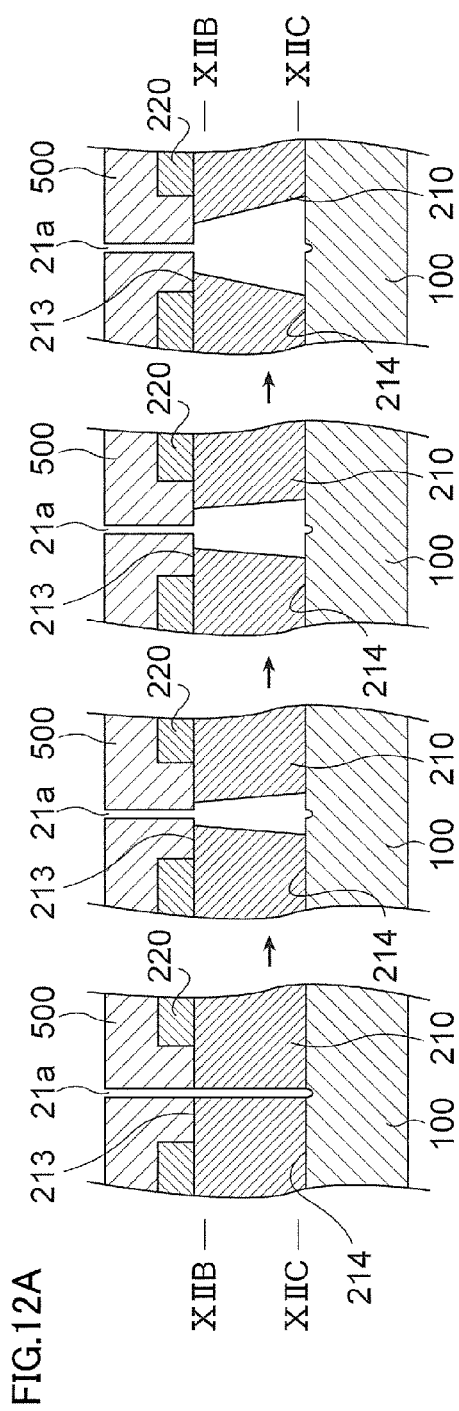
FIGS. 12A to 12C are schematic views illustrating a relation between an etching time in the etching process and changes in shapes of first opening portions and the first irradiation line.
Figure 12B:
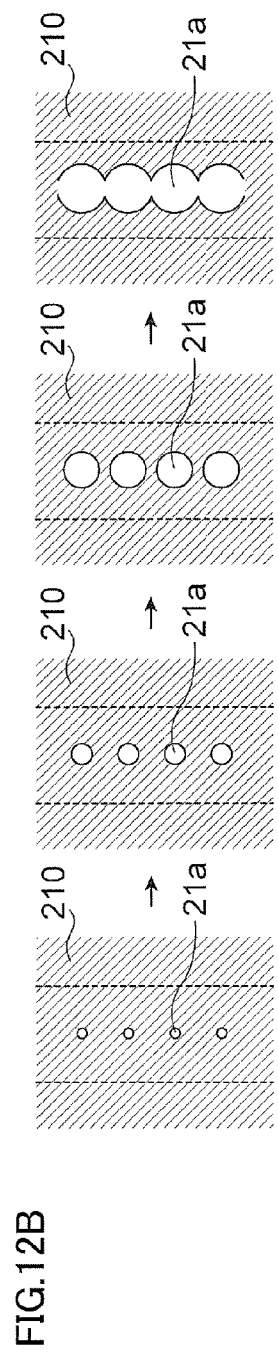
Figure 12C:
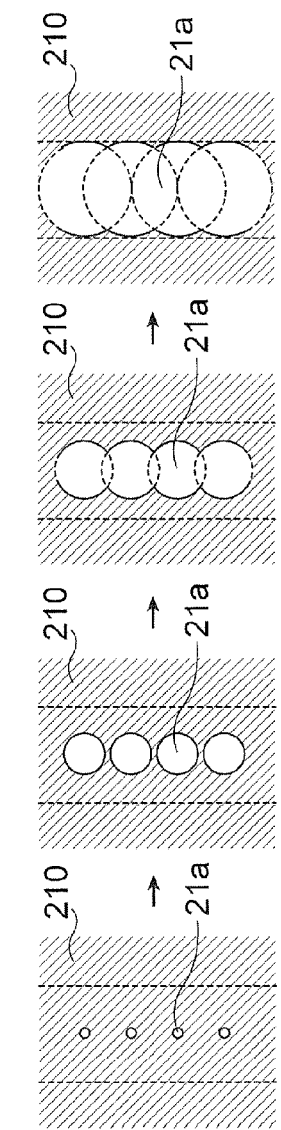

FIGS. 12A to 12C are schematic views illustrating a relation between the etching time in the etching process and changes in shapes of the first opening portion 21*a* and the first irradiation line 21. FIG. 12A is a vertical cross-sectional view of the first opening portion 21*a*, FIG. 12B is a XIIB-XIIB cross-sectional view in FIG. 12A, and FIG. 12C is a XIIC-XIIC cross-sectional view in FIG. 12A.

In each of FIGS. 12A to 12C, the leftmost view of the four views shows the state of the first opening portion 21*a* and the first irradiation line 21 before the wet etching is started. Moreover, the etching process proceeds towards the right view, and the rightmost view shows the state of the first opening portion 21*a* and the first irradiation line 21 at the time when the wert etching is completed.

As shown in FIGS. 12A to 12C, the first opening portion 21*a* before starting the wet etching substantially has a shape of a cylinder. In other words, the diameter of the first opening portion 21*a* is substantially the same between the lower semiconductor top surface 213 side and the lower semiconductor bottom surface 214 side in the lower semiconductor layer 210.

Subsequently, when the element-group formation substrate 10 is immersed in the etching solution, the etching solution enters the inside of the first opening portion 21*a*. Inside the first opening portion 21*a*, the lower semiconductor layer 210 is exposed. Accordingly, the exposed lower semiconductor layer 210 is eroded by the etching solution entered into the first opening portion 21*a*. On the other hand, the protecting film 500 laminated on the lower semiconductor layer 210 and the upper semiconductor layer 220 is not eroded by the etching solution entered into the first opening portion 21*a*.

As shown in FIGS. 12A to 12C, as viewed from the direction vertical to the substrate top surface 113, the wet etching concentrically proceeds in the lower semiconductor layer 210 from the side surface of the first opening portion 21*a* as a starting point. Accordingly, with passage of time for performing the wet etching, the diameter of the first opening portion 21*a* gradually becomes large, and finally, adjacent first opening portions 21*a* are united together. Consequently, the first lower semiconductor side surface 211 is formed, and the lower semiconductor layer 210 laminated on the wafer-shaped sapphire substrate 100 is divided into plural regions along the first direction x (each of the first irradiation lines 21, refer to FIGS. 10A and 10B).

Here, in the exemplary embodiment, the lower semiconductor layer 210 has a difference in easiness of erosion by the etching solution between the lower semiconductor top surface 213 side and the lower semiconductor bottom surface 214 side. Specifically, in comparison with the lower semiconductor top surface 213 side in the lower semiconductor layer 210, the lower semiconductor bottom surface 214 side of the lower semiconductor layer 210 is easily eroded by the etching solution.

The following is the reason thereof.

In general, in comparison with AlGaN, GaN, InGaN or the like constituting the base layer 202, the n-contact layer 203*a* and the like in the exemplary embodiment, MN constituting the intermediate layer 201 in the exemplary embodiment has a property of being easily wet-etched by an etching solution such as orthophosphoric acid.

Moreover, as described above, in the exemplary embodiment, each of the intermediate layer 201, the base layer 202 and the n-contact layer 203*a* constituting the lower semiconductor layer 210 is formed so that crystallinity thereof becomes better along with a move from the side closer to the sapphire substrate 100 toward the side in contact with the upper semiconductor layer 220.

Further, as described above, the group III nitride semiconductor constituting the lower semiconductor layer 210 in the exemplary embodiment grows so that the N-polarity plane thereof faces the substrate top surface 113 of the sapphire substrate 100. In general, in the wet etching of the group III nitride semiconductor, it is known that the etching proceeds from the N-polarity plane side.

By the above reasons, in comparison with the lower semiconductor top surface 213 side, the lower semiconductor layer 210 on the lower semiconductor bottom surface 214 side is easily eroded by the etching solution.

Accordingly, as shown in FIGS. 12A to 12C, as the etching proceeds, the lower semiconductor bottom surface 214 side in the lower semiconductor layer 210 is hollowed a lot compared to the lower semiconductor top surface 213 side. Then, as shown in FIG. 12C, the first lower semiconductor side surfaces 211 having a shape inclined with respect to the direction vertical to the substrate top surface 113 of the sapphire substrate 100 are formed.

Moreover, as described above, the wet etching concentrically proceeds from the side surface of the first opening portion 21*a* as a starting point. Then, the proceeding of the wet etching is faster in the lower semiconductor bottom surface 214 side in the lower semiconductor layer 210 than in the lower semiconductor top surface 213 side.

Accordingly, as shown in FIGS. 12B and 12C, in the first lower semiconductor side surface 211 formed by the wet etching, the plural first depressing portions 211*b* (refer to FIG. 1) in which the horizontal cross-sectional shape thereof is an arc, and the plural first projecting portions 211*a* (refer to FIG. 1), each of which is positioned between the adjacent first depressing portions 211*b*, are formed. Then, the curvature of the arc shape in the first depressing portion 211*b* is smaller in the lower semiconductor bottom surface 214 side than in the lower semiconductor top surface 213 side in the lower semiconductor layer 210.

It should be noted that the etching is preferably completed at the time when the adjacent first opening portions 21*a* are united together, and thereby the first lower semiconductor side surfaces 211 are formed. If the etching time is excessively long, there is a possibility that the projections and depressions on the first lower semiconductor side surface 211 become smaller, or the projections and depressions become vanished.

Subsequently, description will be given to changes in the shapes of the second opening portion 22a and the second irradiation line 22 in the etching process.

Similar to the above-described first opening portion 21a and the first irradiation line 21, the wet etching proceeds from the side surface of the second opening portion 22a as a starting point. Then, with passage of time for performing the wet etching, the second opening portion 22a gradually becomes large, and finally, adjacent second opening portions 22a are united together. Consequently, the second lower semiconductor side surface 212 is formed, and the lower semiconductor layer 210 laminated on the wafer-shaped sapphire substrate 100 is divided into plural regions along the second direction y (each of the second irradiation lines 22, refer to FIG. 10).

Moreover, as the description given to the first opening portion 21a and the first irradiation line 21, in comparison with the lower semiconductor top surface 213 side in the lower semiconductor layer 210, the lower semiconductor bottom surface 214 side of the lower semiconductor layer 210 is easily eroded by the etching solution. Accordingly, similar to the first opening portion 21a and the first irradiation line 21, as the etching proceeds, the second opening portion 22a and the second irradiation line 22 of the lower semiconductor bottom surface 214 side in the lower semiconductor layer 210 are hollowed a lot compared to those of the lower semiconductor top surface 213 side. Then, the second lower semiconductor side surfaces 212 having a shape inclined with respect to the direction vertical to the substrate top surface 113 of the sapphire substrate 100 are formed.

In the exemplary embodiment, in the semiconductor laminating process in step 101, the laminated semiconductor layer 200 is laminated on the wafer-shaped sapphire substrate 100 so that the crystal structure of the group III nitride semiconductor constituting the laminated semiconductor layer 200 is different in the first direction x and the second direction y (refer to FIG. 8).

Here, regarding the group III nitride semiconductor, it is known that there is a difference in easiness of etching by an etching solution depending upon crystal orientation.

Accordingly, proceeding of the wet etching started from the side surface of the second opening portion 22a is different from proceeding of the wet etching started from the side surface of the first opening portion 21a. Consequently, the shape of projections and depressions on the second lower semiconductor side surface 212 formed in the etching process is different from the shape of projections and depressions on the first lower semiconductor side surface 211. For example, in the exemplary embodiment, the shape of projections and depressions, which is configured with the second flat portion 212b that is inclined with respect to the direction vertical to the substrate top surface 113 and is substantially flat and the plural second protruding portions 212a that protrude toward the outside of the lower semiconductor layer 210 from the second flat portion 212b, is formed on the second lower semiconductor side surface 212.

It should be noted that, in the etching process in the exemplary embodiment, it is assumed that the wet etching is performed so that the adjacent first opening portions 21a are united together. However, the wet etching is not necessarily performed so that the adjacent first opening portions 21a are united together.

As described above, in the etching process, upon starting from each of the first opening portions 21a, the lower semiconductor bottom surface 214 side in the lower semiconductor layer 210 is hollowed a lot compared to the lower semiconductor top surface 213 side. Accordingly, even in the case where the adjacent first opening portions 21a are not united together by the wet etching, an inner wall in each of the first opening portions 21a after performing the wet etching becomes inclined with respect to the direction vertical to the substrate top surface 113. Consequently, in the dividing process in step 106 to be described later, the first lower semiconductor side surface 211 having the projections and depressions inclined with respect to the direction vertical to the substrate top surface 113 can be obtained by dividing the element-group formation substrate 10 along the first irradiation lines 21 and the second irradiation lines 22.

Similarly, the wet etching is not necessarily performed so that the adjacent second opening portions 22a are united together.

Subsequently, the polishing process in step 105 will be described.

In the polishing process in step 105, the substrate bottom surface 114 of the sapphire substrate 100 is ground and polished so that the sapphire substrate 100 in the element-group formation substrate 10, in which the lower semiconductor layer 210 is separated into the plural regions by the etching process in step 204, has a predetermined thickness.

The thickness of the sapphire substrate 100 after processing is 60 μm to 300 μm, preferably 80 μm to 250 μm, and more preferably 100 μm to 200 μm. By providing the thickness of the sapphire substrate 100 within the above ranges, division of the element-group formation substrate 10 becomes easier, and the element-group formation substrate 10 can be efficiently divided in the dividing process in step 106.

Here, in the case where the laminated semiconductor layer 200 composed of the group III nitride semiconductor is laminated on the sapphire substrate 100 composed of sapphire single crystal, due to a difference in a lattice constant or thermal expansion coefficient between the sapphire substrate 100 and the laminated semiconductor layer 200, warping occurs in the element-group formation substrate 10 in some cases. Then, in the case where the element-group formation substrate 10 has large warping, there is a possibility that the element-group formation substrate 10 is broken in the process of grinding and polishing the sapphire substrate 100.

In the exemplary embodiment, in the surface laser process (first surface laser process and second surface laser process) in step 103, the plural first opening portions 21a and the plural second opening portions 22a are formed by laser light irradiation such that the laser light penetrates the lower semiconductor layer 210 and reaches the sapphire substrate 100. Accordingly, in the region where the first opening portions 21a or the second opening portions 22a are formed, a region where the laminated semiconductor layer 200 partially does not exist is formed on the sapphire substrate 100.

Further, on the sapphire substrate 100, plural laser marks are formed due to laser irradiation. Consequently, it becomes possible to relieve the warping of the sapphire substrate 100 in the element-group formation substrate 10.

Accordingly, compared to the case where the laser irradiation is performed so that the laser light does not penetrate the lower semiconductor layer 210 and does not reach the sapphire substrate 100, it becomes possible to relieve warping of the element-group formation substrate 10, and thereby becomes possible to suppress breaking of the element-group formation substrate 10 in the polishing process.

Subsequently, the dividing process in step 106 will be described.

In the dividing process, the element-group formation substrate 10, in which the lower semiconductor layer 210 has been separated into plural regions by the etching process in step 104 and the sapphire substrate 100 has been polished by the polishing process in step 105, is cut along the first irradiation lines 21 and the second irradiation lines 22, and thereby divided into the plural semiconductor light emitting elements 1.

Specifically, first, laser irradiation is applied to the inside of the sapphire substrate 100 along the first irradiation lines 21 and the second irradiation lines 22 from the substrate bottom surface 114 (refer to FIG. 3) side of the wafer-shaped sapphire substrate 100 in the element-group formation substrate 10. Accordingly, inside the sapphire substrate 100, plural modified regions, in which sapphire single crystal is modified along the first irradiation lines 21 and the second irradiation lines 22, are formed.

Subsequently, by pressing a blade from the substrate bottom surface 114 side of the wafer-shaped sapphire substrate 100 along the modified regions formed along the first irradiation lines 21 and the second irradiation lines 22, cracks starting on the modified regions are caused, to thereby divide the wafer-shaped sapphire substrate 100 into plural sapphire substrates 100. At this time, on each of the divided sapphire substrates 100, there exist the lower semiconductor layer 210, the upper semiconductor layer 220, the p-electrode 300 and the n-electrode 400.

By the division, the first substrate side surfaces 111 and the second substrate side surfaces 112 in the sapphire substrate 100 are formed. Moreover, with the division, at the border portion between the first substrate side surface 111 and the substrate top surface 113 in the sapphire substrate 100, the first cutout row 121 configured with the plural first cutouts 121a arranged in the first direction x is formed. In the same manner, at the border portion between the second substrate side surface 112 and the substrate top surface 113, the second cutout row 122 configured with the plural second cutouts 122a arranged in the second direction y is formed.

Here, the plural first cutouts 121a are derived from the laser marks formed with the formation of the respective plural first opening portions 21a in the surface laser process in step 103. Similarly, the plural second cutouts 122a are derived from the laser marks formed with the formation of the respective plural second opening portions 22a in the surface laser process in step 103.

Then, through the above processes, the semiconductor light emitting element 1 shown in FIG. 1 can be obtained.

Here, in the exemplary embodiment, when the first irradiation lines 21 and the second irradiation lines 22 are formed in the surface laser process in step 103, the laser irradiation is performed so that the laser light reaches the sapphire substrate 100. Accordingly, on the substrate top surface 113 of the wafer-shaped sapphire substrate 100 in the element-group formation substrate 10, there exist the laser marks along the first direction x, which are derived from the first irradiation lines 21, and the laser marks along the second direction y, which are derived from the second irradiation lines 22.

In the case where the plural modified regions are formed by performing laser irradiation from the substrate bottom surface 114 side of the wafer-shaped sapphire substrate 100 in the element-group formation substrate 10, it is possible to perform laser irradiation with the laser marks formed on the substrate top surface of the sapphire substrate 100 as markings. Consequently, it becomes easier to form the modified regions along the first irradiation lines 21 and the second irradiation lines 22, to thereby make it possible to improve accuracy in dividing the element-group formation substrate 10.

Further, in the case where the blade is pressed from the substrate bottom surface 114 side of the wafer-shaped sapphire substrate 100, the cracks starting on the modified regions reach the laser marks derived from the first irradiation lines 21 and the laser marks derived from the second irradiation lines 22. Accordingly, since the element-group formation substrate 10 is to be divided from the laser marks derived from the first irradiation lines 21 and the second irradiation lines 22 as the starting points, it is possible to suppress the possibility that the cutting surface of the sapphire substrate 100 reaches the lower semiconductor layer 210 and the like while having a bend with respect to the first direction x or the second direction y. Consequently, compared to the case where the present configuration is not provided, it becomes possible to suppress chipping in the lower semiconductor layer 210, and to suppress generation of defective semiconductor light emitting element 1.

It should be noted that, in the dividing process, the cracks starting on the modified regions do not necessarily reach the laser marks derived from the first irradiation lines 21 and the second irradiation lines 22, and there are some cases where part of the cutting surface of the sapphire substrate 100 deviates from the laser marks derived from the first irradiation lines 21 and the second irradiation lines 22. In this case, sometimes, the first cutouts 121a are not formed in some regions at the border portion between the first substrate side surface 111 and the substrate top surface 113, and the second cutouts 122a are not formed in some regions at the border portion between the second substrate side surface 112 and the substrate top surface 113. Accordingly, the semiconductor light emitting element 1 as shown in FIG. 1 is not necessarily obtained.

However, even in such a case, if at least two first cutouts 121a or two second cutouts 122a are formed at the border portion between the first substrate side surface 111 or the second substrate side surface 112 and the substrate top surface 113 in the semiconductor light emitting element 1 obtained by the dividing process, it is included in the scope of the present invention.

Exemplary Embodiment 2

In the semiconductor light emitting element 1 in the exemplary embodiment 1, the first lower semiconductor side surface 211 is formed so that the curvature of the first depressing portion 211b becomes gradually larger along with a move from the lower semiconductor bottom surface 214 side toward the lower semiconductor top surface 213 side. Further, the second lower semiconductor side surface 212 is formed so that the plural second protruding portions 212a are provided on the lower semiconductor top surface 213 side and the flat surface is provided on the lower semiconductor bottom surface 214 side. However, shape of the first lower semiconductor side surface 211 and the shape of the second lower semiconductor side surface 212 are not limited thereto. Hereinafter, description will be given to an exemplary embodiment 2 according to the present invention. It should be noted that same symbols are assigned to configurations same as those in the exemplary embodiment 1, and detailed description thereof will be omitted.

Figure 13:
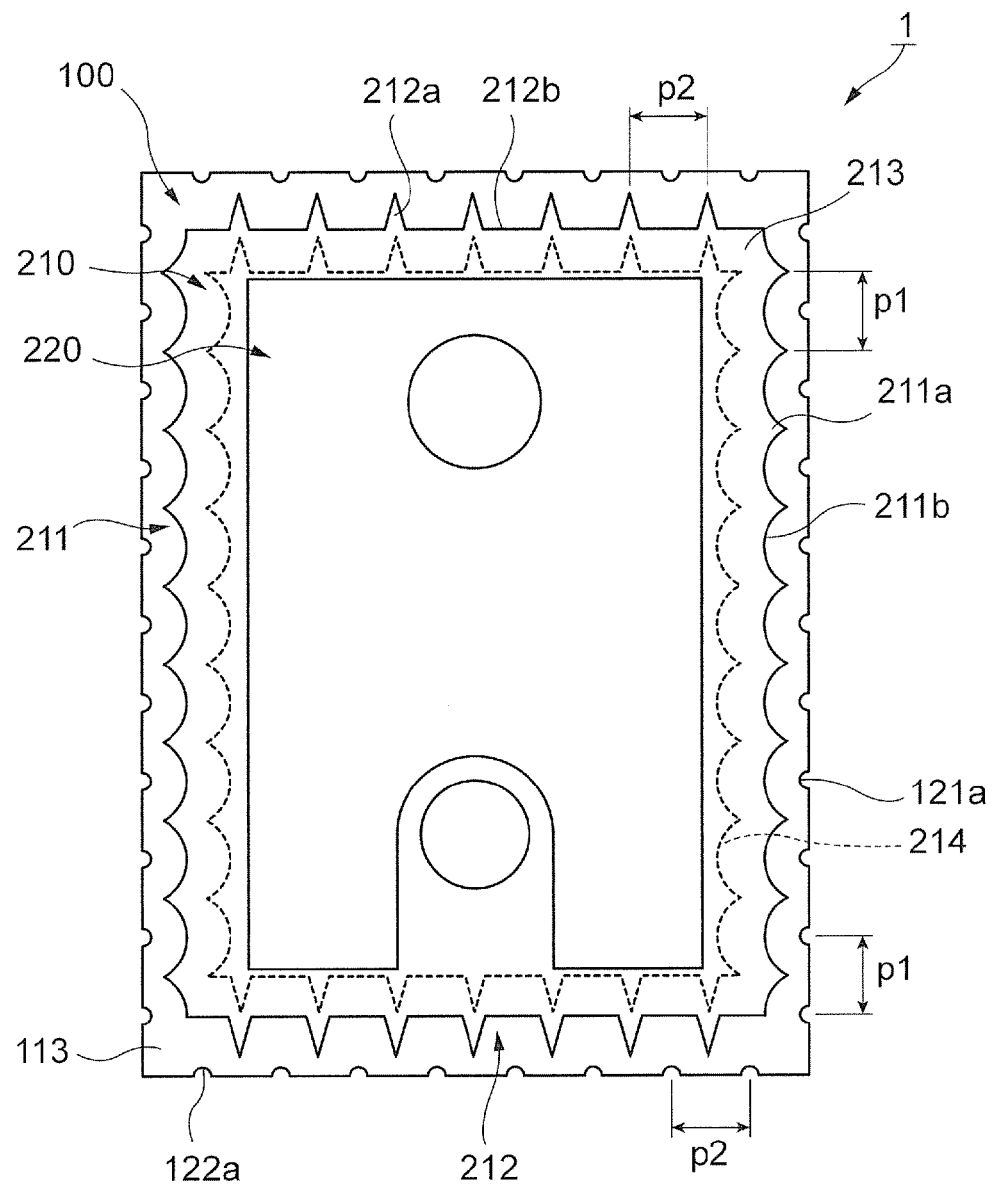
FIG. 13 is an example of a top view of a semiconductor light emitting element in an exemplary embodiment 2.

FIG. 13 is an example of a top view of the semiconductor light emitting element 1 in the exemplary embodiment 2.

Similar to the semiconductor light emitting element 1 in the exemplary embodiment 1, in the semiconductor light emitting element 1 in the exemplary embodiment, the first lower semiconductor side surface 211 and the second lower semiconductor side surface 212 are provided with inclination toward the outside with respect to the direction vertical to the substrate top surface 113.

Then, as shown in FIG. 13, the first lower semiconductor side surface 211 in the exemplary embodiment is formed so that the first depressing portion 211b has the same curvature on the lower semiconductor top surface 213 side and the lower semiconductor bottom surface 214 side. Moreover, the second lower semiconductor side surface 212 in the exemplary embodiment is formed so that each of the plural second protruding portions 212a is formed to extend in the third direction z from the lower semiconductor bottom surface 214 side toward the lower semiconductor top surface 213 side, and the second flat portions 212b are divided into plural regions by the second protruding portions 212a.

Figure 14A:
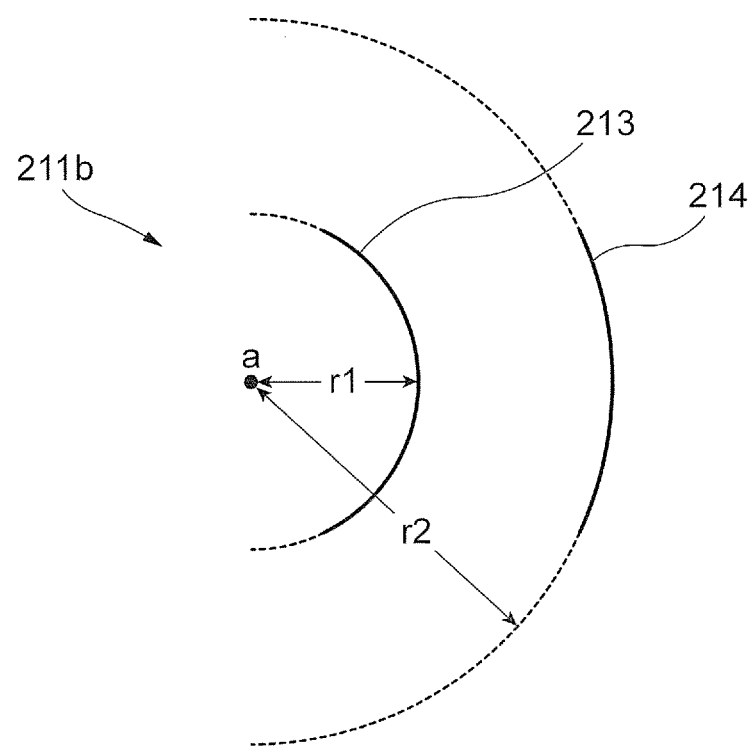
FIGS. 14A and 14B are schematic views for illustrating a shape of a first lower semiconductor side surface of the semiconductor light emitting element in an exemplary embodiment 1 and the exemplary embodiment 2.
Figure 14B:
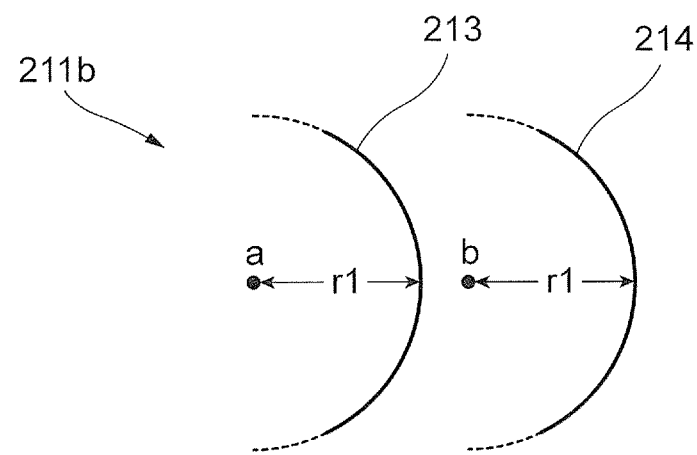

FIGS. 14A and 14B are schematic views for illustrating the shape of the first lower semiconductor side surface 211 of the semiconductor light emitting element 1 in the exemplary embodiment 1 and the exemplary embodiment 2. FIG. 14A is a schematic view for illustrating the shape of the first depressing portion 211b of the first lower semiconductor side surface 211 in the exemplary embodiment 1, and represents a horizontal cross-sectional view of the lower semiconductor top surface 213 side and the lower semiconductor bottom surface 214 side in the first depressing portion 211b in the exemplary embodiment 1. Similarly, FIG. 14B is a schematic view for illustrating the shape of the first depressing portion 211b of the first lower semiconductor side surface 211 in the exemplary embodiment 2, and represents a horizontal cross-sectional view of the lower semiconductor top surface 213 side and the lower semiconductor bottom surface 214 side in the first depressing portion 211b in the exemplary embodiment 2.

The first lower semiconductor side surface 211 in the exemplary embodiment 1 is, as shown in FIG. 14A, formed so that the curvature of the first depressing portion 211b on the lower semiconductor bottom surface 214 side becomes smaller than the curvature of the first depressing portion 211b on the lower semiconductor top surface 213 side. To be described specifically, in the case of viewing the first depressing portion 211b from the third direction z, the first depressing portion 211b on the lower semiconductor top surface 213 side forms an arc around a point a with a radius r1. On the other hand, the first depressing portion 211b on the lower semiconductor bottom surface 214 side forms an arc around the point a with a radius r2, which is larger than the radius r1 (r1<r2). In other words, in the case of viewing from the third direction z, the first depressing portions 211b form concentric circles on the lower semiconductor bottom surface 214 side and the lower semiconductor top surface 213 side. Accordingly, the curvature of the first depressing portion 211b on the lower semiconductor bottom surface 214 side is set smaller than the curvature of the first depressing portion 211b on the lower semiconductor top surface 213 side.

It should be noted that the position of the point a in the exemplary embodiment corresponds the position where the first cutout 121a provided on the sapphire substrate 100 is provided.

In contrast, the first lower semiconductor side surface 211 in the exemplary embodiment 2 is, as shown in FIG. 14B, formed so that the curvature of the first depressing portion 211b on the lower semiconductor bottom surface 214 side and the curvature of the first depressing portion 211b on the lower semiconductor top surface 213 side are substantially equal. To be described specifically, in the case of viewing the first depressing portion 211b from the third direction z, the first depressing portion 211b on the lower semiconductor top surface 213 side forms an arc around the point a with the radius r1. On the other hand, the first depressing portion 211b on the lower semiconductor bottom surface 214 side forms an arc around a point b, which is positioned closer to the facing first lower semiconductor side surface 211 than the point a, with the radius r1. In other words, in the exemplary embodiment 2, in the first depressing portion 211b, the curvatures are substantially the same on the lower semiconductor bottom surface 214 side and the lower semiconductor top surface 213 side, and the central position of the arc formed by the horizontal cross section of the first depressing portion 211b is different between the lower semiconductor bottom surface 214 side and the lower semiconductor top surface 213 side.

Further, as shown in FIG. 13, in the second lower semiconductor side surface 212 in the exemplary embodiment 2, the curvatures in a circumscribed circle of a hexagon in which adjacent three sides are constituted by the second protruding portions 212a and the second flat portion 212b are substantially equal on the lower semiconductor bottom surface 214 side and the lower semiconductor top surface 213 side. Then, the central positions of the circumscribed circle of the hexagon in which adjacent three sides are constituted by the second protruding portions 212a and the second flat portion 212b are different between the lower semiconductor bottom surface 214 side and the lower semiconductor top surface 213 side.

Here, the semiconductor light emitting element 1 according to the exemplary embodiment 2 can be obtained by, for example, appropriately selecting the first direction x and the second direction y in the semiconductor laminating process in step 101 and the element-group forming process in step 102, and/or appropriately changing the etching conditions in the etching process in step 104 described in the exemplary embodiment (refer to FIG. 7).

As described above, in each of the first lower semiconductor side surface 211 and the second lower semiconductor side surface 212 in the semiconductor light emitting element 1 of the exemplary embodiment, similar to the semiconductor light emitting element 1 of the exemplary embodiment 1, the projections and depressions are formed, and each has a structure inclined to the outside with respect to the direction vertical to the substrate top surface 113. Accordingly, compared to the case where the present configuration is not provided, it becomes possible to improve the light extraction efficiency in the semiconductor light emitting element 1.

It should be noted that, the configurations of the projections and depressions provided on the first lower semiconductor side surface 211 and the second lower semiconductor side surface 212 in the semiconductor light emitting element 1 are not limited to those in the above-described exemplary embodiment 1 and the exemplary embodiment 2. For example, the configuration of the exemplary embodiment 1 and the configuration of the exemplary embodiment 2 may be used in combination.

Specifically, in the first lower semiconductor side surface 211, the curvature of the first depressing portion 211b on the lower semiconductor bottom surface 214 side may be set smaller than the curvature of the first depressing portion 211b on the lower semiconductor top surface 213 side, and the central position of the first depressing portion 211b on the lower semiconductor bottom surface 214 side and the central position of the first depressing portion 211b on the lower semiconductor bottom surface 213 side may be caused to be different.

Moreover, in the exemplary embodiment 1 and the exemplary embodiment 2, description is given to the case where the shape of the projections and depressions on the first lower semiconductor side surface 211 and the shape of the projections and depressions on the second lower semiconductor side surface 212 are different, but these are not necessarily different. However, in terms of the light extraction efficiency of the semiconductor light emitting element 1, the shape of the projections and depressions on the first lower semiconductor side surface 211 and the shape of the projections and depressions on the second lower semiconductor side surface 212 are preferably different.

In the exemplary embodiment 1 and the exemplary embodiment 2, as an example of the case where the shape of the projections and depressions on the first lower semiconductor side surface 211 and the shape of the projections and depressions on the second lower semiconductor side surface 212 are different, description is given to the one in which the first pitch p1 and the second pitch p2 are equal, and an outline of the first lower semiconductor side surface 211 in the horizontal cross-sectional view and an outline of the second lower semiconductor side surface 212 in the horizontal cross-sectional view are different. However, the case where the shape of the projections and depressions on the first lower semiconductor side surface 211 and the shape of the projections and depressions on the second lower semiconductor side surface 212 are different is not limited thereto.

For example, the one in which the shape of the projections and depressions on the first lower semiconductor side surface 211 and the shape of the projections and depressions on the second lower semiconductor side surface 212 are different due to the difference between the first pith p1 and the second pitch p2 is also included. It should be noted that, in the case where the first pitch p1 and the second pitch p2 are different, the outline of the first lower semiconductor side surface 211 in the horizontal cross-sectional view and the outline of the second lower semiconductor side surface 212 in the horizontal cross-sectional view may be the same or different.

As a method for making a difference between the first pitch p1 and the second pitch p2, in the surface laser irradiation process in the above-described step 103, the pitch of the laser for forming the first irradiation lines 21 (first pitch p1) and the pitch of the laser for forming the second irradiation lines 22 (second pitch p2) may be caused to be different.

In the exemplary embodiment 1 and the exemplary embodiment 2, it is assumed that the shape of the projections and depressions on the first lower semiconductor side surface 211 periodically changes along the first direction x, and the shape of the projections and depressions on the second lower semiconductor side surface 212 periodically changes along the second direction y. However, the shapes of the projections and depressions on the first lower semiconductor side surface 211 and the second lower semiconductor side surface 212 are not necessarily changed periodically.

Moreover, in the exemplary embodiment 1 and the exemplary embodiment 2, it is assumed that the shape of the projections and depressions is provided to the first lower semiconductor side surface 211 and the second lower semiconductor side surface 212, which are the side surface of the lower semiconductor layer 210, and the shape of the projections and depressions is not provided to the first upper semiconductor side surface 221 and the second upper semiconductor side surface 222, which are the side surface of the upper semiconductor layer 220. However, the projections and depressions may be provided both of the first lower semiconductor side surface 211 and the second lower semiconductor side surface 212, and the first upper semiconductor side surface 221 and the second upper semiconductor side surface 222.

Furthermore, in the exemplary embodiment 1 and the exemplary embodiment 2, description is given to the case in which the first lower semiconductor side surface 211 is along the first direction x and is inclined to the outside of the lower semiconductor layer 210 with respect to the plane vertical to the substrate top surface 113, and the second lower semiconductor side surface 212 is along the second direction y and is inclined to the outside of the lower semiconductor layer 210 with respect to the plane vertical to the substrate top surface 113. But, the first lower semiconductor side surface 211 and the second lower semiconductor side surface 212 do not necessarily have such a configuration.

However, in terms of the light extraction efficiency of the semiconductor light emitting element 1, the first lower semiconductor side surface 211 and the second lower semiconductor side surface 212 are preferably inclined with respect to the direction vertical to the substrate top surface 113. Further, the first lower semiconductor side surface 211 and the second lower semiconductor side surface 212 are more preferably inclined to the outside of the lower semiconductor layer 210 with respect to the direction vertical to the substrate top surface 113.

In the exemplary embodiment 1, the first direction x along the longer direction of the semiconductor light emitting element 1 is assumed to be the direction along the M-plane of the sapphire single crystal constituting the sapphire substrate 100, and the second direction y along the shorter direction of the semiconductor light emitting element 1 is assumed to be the direction along the A-plane of the sapphire single crystal constituting the sapphire substrate 100. However, orientation of the first direction x and the second direction y is not limited thereto, but can be appropriately selected.

Here, for example, in the case where, as the first direction x and the second direction y, equivalent directions in the sapphire single crystal constituting the sapphire substrate 100 are selected, easiness in wet etching of the laminated semiconductor layer 200 laminated on the sapphire substrate 100 becomes equal in the first direction x and the second direction y in some cases. In this case, by causing the first pitch p1 and the second pitch p2 to be different, the shape of the projections and depressions on the first lower semiconductor side surface 211 and the shape of the projections and depressions on the second lower semiconductor side surface 212 may be differentiated.

Moreover, in the exemplary embodiment 1 and the exemplary embodiment 2, the shape of the semiconductor light emitting element 1 as viewed from the side where the p-electrodes 300 and the n-electrodes 400 are formed is assumed to be a rectangle in which the first direction x is the longer side and the second direction y is the shorter side; however, the shape of the semiconductor light emitting element 1 is not limited thereto. For example, the shape of the semiconductor light emitting element 1 as viewed from the side where the p-electrodes 300 and the n-electrodes 400 are formed may be other quadrangle such as a square or a parallelogram, or may be a polygon other than the quadrangle.

Further, in the exemplary embodiment 1 and the exemplary embodiment 2, at the border portion between the substrate top surface 113 and the first substrate side surface 111 of the sapphire substrate 100, the first cutouts 121a are formed in a region corresponding to the first depressing portions 211b on the first lower semiconductor side surface 211. Similarly, at the border portion between the substrate top surface 113 and the second substrate side surface 112 of the sapphire substrate 100, the second cutouts 122a are formed in a region corresponding to the second flat portion 212b positioned at the center of the adjacent second protruding portions 212a on the second lower semiconductor side surface 212.

However, the shape of the projections and depressions on the first lower semiconductor side surface 211 and the first cutouts 121a are not necessarily provided in association with each other. Similarly, the shape of the projections and depressions on the second lower semiconductor side surface 212 and the second cutouts 122a are not necessarily provided in association with each other.

The invention claimed is:

1. A semiconductor light emitting element having a substrate and a semiconductor layer, which includes a light emitting layer that emits light by current flow and is laminated on the substrate, wherein:
the substrate includes a substrate top surface on which the semiconductor layer is laminated, a substrate bottom surface provided on an opposite side of the substrate top surface, and a substrate side surface formed to enclose the peripheral edge of the substrate top surface and the substrate bottom surface, and is provided with a plurality of cutouts, which are formed by cutting out a part of the substrate and are arranged at intervals along a border between the substrate top surface and the substrate side surface;
the semiconductor layer includes a semiconductor bottom surface provided in contact with the substrate top surface, a semiconductor top surface provided on an opposite side of the semiconductor bottom surface, and a semiconductor side surface provided to enclose the peripheral edge of the semiconductor bottom surface and the semiconductor top surface; and
on the semiconductor side surface, projections and depressions are formed by arranging a plurality of depression portions, each of which extends from a semiconductor bottom surface side toward a semiconductor top surface side, and depresses toward an inside of the semiconductor layer,
wherein the area of the bottom surface of the semiconductor layer is less than the area of the top surface of the semiconductor layer.

2. The semiconductor light emitting element according to claim 1, wherein
the semiconductor layer has a first semiconductor layer provided between the substrate and the light emitting layer, and a second semiconductor layer that includes the light emitting layer and is provided on the first semiconductor layer, and
the plurality of depression portions are provided in a region where the first semiconductor layer of the semiconductor side surface is exposed.

3. The semiconductor light emitting element according to claim 1, wherein the semiconductor side surface is provided to be inclined with respect to a direction vertical to the substrate top surface.

4. The semiconductor light emitting element according to claim 3, wherein an angle formed by the semiconductor bottom surface and the semiconductor side surface is larger than 90 degrees.

5. The semiconductor light emitting element according to claim 1, wherein a horizontal cross-sectional shape of the depression portion is different between the semiconductor bottom surface side and the semiconductor top surface side.

6. The semiconductor light emitting element according to claim 5, wherein a curvature of the depression portion on the semiconductor bottom surface side is smaller than a curvature of the depression portion on the semiconductor top surface side.

7. The semiconductor light emitting element according to claim 5, wherein a curvature of the depression portion on the semiconductor bottom surface side is substantially equal to a curvature of the depression portion on the semiconductor top surface side, and a central axis of the depression portion is different between the semiconductor bottom surface side and the semiconductor top surface side.

8. The semiconductor light emitting element according to claim 5, wherein, in the semiconductor side surface, the projections and depressions are formed larger on the semiconductor top surface side in the semiconductor side surface than on the semiconductor bottom surface side in the semiconductor side surface.

9. The semiconductor light emitting element according to claim 1, wherein
the substrate side surface includes a first substrate side surface along a first direction and a second substrate side surface along a second direction intersecting the first direction,
the plurality of cutouts are arranged along the first direction with first intervals at a border between the substrate top surface and the first substrate side surface, and the plurality of cutouts are arranged along the second direction with second intervals at a border between the substrate top surface and the second substrate side surface,
the semiconductor side surface includes a first semiconductor side surface along the first direction and a second semiconductor side surface along the second direction,
on the first semiconductor side surface, the plurality of depression portions are arranged, each of which corresponds to each of the plurality of cutouts arranged at the border between the substrate top surface and the first substrate side surface, on the second semiconductor side surface, the plurality of depression portions are arranged, each of which corresponds to each of the plurality of cutouts arranged at the border between the substrate top surface and the second substrate side surface, and the depression portions arranged on the first semiconductor side surface and the depression portions arranged on the second semiconductor side surface are different in shape.

10. The semiconductor light emitting element according to claim 1, wherein projections and depressions are formed on the substrate top surface.

11. The semiconductor light emitting element according to claim 1, wherein the cross-sectional area of the semiconductor layer decreases in the vertical direction towards the substrate.

12. The semiconductor light emitting element according to claim 1, wherein the peripheral edge of the top surface is an exposed surface.

13. The semiconductor light emitting element according to claim 1, wherein the depression portions arranged on the first semiconductor side surface have an arcuate cross-sectional shape, and the depression portions on the second semiconductor side surface have a flat cross-sectional flat.

14. A method for producing the semiconductor light emitting element according to claim 1, comprising:
a laser irradiation process that sequentially irradiates a semiconductor lamination substrate, in which a semiconductor layer including a light emitting layer that emits light by passing a current is laminated on a top surface of a substrate having the top surface and a bottom surface provided on an opposite side of the top surface, with laser light from a side where the semiconductor layer is laminated, to thereby form a plurality of openings, each of which penetrates the semiconductor layer and is formed by cutting out a part of the substrate, arranged with an interval to the adjacent opening;
an etching process that applies wet etching to the semiconductor layer in the semiconductor lamination substrate, in which the plurality of openings are formed; and a dividing process that divides the semiconductor lamination substrate along an arrangement of the plurality of openings.

15. The method for producing a semiconductor light emitting element according to claim 14, wherein, in the etching process, the wet etching is applied to the semiconductor layer so that the adjacent openings are united together.

16. The method for producing a semiconductor light emitting element according to claim 14, further comprising:
prior to the laser irradiation process, a protecting film forming process that forms a protecting film on the semiconductor layer, wherein
in the laser irradiation process, the semiconductor lamination substrate, on which the protecting film is formed, is irradiated with laser light from a side where the protecting film is formed so that the laser light reaches the top surface of the substrate through the protecting film and the semiconductor layer, and
in the etching process, the wet etching is applied to the semiconductor layer in the semiconductor lamination substrate with the protecting film being formed on the semiconductor layer.

17. The method for producing a semiconductor light emitting element according to claim 14, wherein the laser irradiation process comprises:
a first laser irradiation process that sequentially irradiates the semiconductor lamination substrate, in which the semiconductor layer containing a group III nitride is laminated on the top surface configured with a C-plane of a sapphire single crystal, with laser light in a first direction along an M-plane of the sapphire single crystal, to thereby form the plurality of openings arranged with first intervals along the first direction; and
a second laser irradiation process that sequentially irradiates the semiconductor lamination substrate with laser light in a second direction intersecting the first direction, to thereby form the plurality of openings arranged with second intervals along the second direction.

18. The method for producing a semiconductor light emitting element according to claim 14, further comprising a semiconductor laminating process that laminates the semiconductor layer on the top surface of the substrate, on which a process for forming projections and depressions is applied, to thereby form the semiconductor lamination substrate.

19. A light emitting device comprising:
a semiconductor light emitting element having a substrate and a semiconductor layer, which includes a light emitting layer that emits light by passing a current and is laminated on the substrate; and
an electrical power supply member that supplies electrical power to the semiconductor light emitting element, wherein
the substrate includes a substrate top surface on which the semiconductor layer is laminated, a substrate bottom surface provided on an opposite side of the substrate top surface and a substrate side surface formed to enclose the peripheral edge of the substrate top surface and the substrate bottom surface, and is provided with a plurality of cutouts, which are formed by cutting out a part of the substrate and are arranged at intervals along a border between the substrate top surface and the substrate side surface,
the semiconductor layer includes a semiconductor bottom surface provided in contact with the substrate top surface, a semiconductor top surface provided on an opposite side of the semiconductor bottom surface and a semiconductor side surface provided to enclose the peripheral edge of the semiconductor bottom surface and the semiconductor top surface, and
the semiconductor side surface includes a plurality of depression portions, each of which extends from a semiconductor bottom surface side toward a semiconductor top surface side, and depresses toward an inside of the semiconductor layer,
wherein the area of the bottom surface of the semiconductor layer is less than the area of the top surface of the semiconductor layer.

20. The light emitting device according to claim 19, wherein
an angle formed by the semiconductor bottom surface and the semiconductor side surface is larger than 90 degrees, and
the semiconductor light emitting element extracts light from the semiconductor top surface side in the semiconductor layer.

* * * * *